United States Patent
Ito et al.

(10) Patent No.: US 8,354,322 B2
(45) Date of Patent: Jan. 15, 2013

(54) FABRICATING AND OPERATING A MEMORY ARRAY HAVING A MULTI-LEVEL CELL REGION AND A SINGLE-LEVEL CELL REGION

(75) Inventors: Fumitoshi Ito, Yokohama (JP); Shinji Sato, Chigasaki (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/187,399

(22) Filed: Jul. 20, 2011

(65) Prior Publication Data

US 2011/0275186 A1 Nov. 10, 2011

Related U.S. Application Data

(62) Division of application No. 12/414,567, filed on Mar. 30, 2009, now Pat. No. 8,026,544.

(51) Int. Cl.
*H01L 21/8249* (2006.01)

(52) U.S. Cl. ............... 438/301; 438/218; 365/185.17; 257/E27.108

(58) Field of Classification Search .............. 438/211, 438/218, 219, 232, 257, 275, 279, 294, 301; 365/185.01, 185.17; 257/E27.064, E27.108
See application file for complete search history.

(56) References Cited

U.S. PATENT DOCUMENTS

| | | | |
|---|---|---|---|
| 5,812,457 A | 9/1998 | Arase | |
| 5,966,326 A | 10/1999 | Park et al. | |
| 6,468,862 B1 | 10/2002 | Tseng | |
| 6,956,770 B2 | 10/2005 | Khalid et al. | |
| 7,339,834 B2 | 3/2008 | Lutze | |
| 7,745,284 B2 | 6/2010 | Hwang et al. | |
| 7,786,525 B2 | 8/2010 | Shimizu | |
| 7,898,856 B2 | 3/2011 | Aritome | |
| 2004/0213048 A1 | 10/2004 | Park et al. | |
| 2004/0233713 A1 | 11/2004 | Iwase et al. | |
| 2006/0223264 A1 | 10/2006 | Park et al. | |
| 2007/0087504 A1 | 4/2007 | Pham et al. | |

(Continued)

FOREIGN PATENT DOCUMENTS

EP 0119729 A1 9/1984

OTHER PUBLICATIONS

International Search Report and Written Opinion of the International Searching Authority dated Jun. 2, 2010, International Application No. PCT/US2010/026674, filed Mar. 9, 2010, 10 pages.

(Continued)

*Primary Examiner* — Thanh V Pham
(74) *Attorney, Agent, or Firm* — Vierra Magen Marcus & DeNiro LLP

(57) ABSTRACT

Techniques are disclosed herein for applying different process steps to single-level cell (SLC) blocks in a memory array than to multi-level cell (MLC) blocks such that the SLC blocks will have high endurance and the MLC blocks will have high reliability. In some aspects, different doping is used in the MLC blocks than the SLC blocks. In some aspects, different isolation is used in the MLC blocks than the SLC blocks. Techniques are disclosed that apply different read parameters depending on how many times a block has been programmed/erased. Therefore, blocks that have been cycled many times are read using different parameters than blocks that have been cycled fewer times.

17 Claims, 21 Drawing Sheets

U.S. PATENT DOCUMENTS

| | | |
|---|---|---|
| 2007/0187778 A1 | 8/2007 | Cannon et al. |
| 2008/0062762 A1* | 3/2008 | Doyle ..................... 365/185.11 |
| 2008/0079052 A1 | 4/2008 | Ito |
| 2008/0081419 A1 | 4/2008 | Ito |
| 2008/0273389 A1 | 11/2008 | Aritome et al. |
| 2009/0103360 A1* | 4/2009 | Kang et al. ............... 365/185.03 |
| 2010/0246257 A1 | 9/2010 | Ito et al. |
| 2010/0265767 A1 | 10/2010 | Hazama |

OTHER PUBLICATIONS

Office Action Restriction dated Mar. 1, 2011, U.S. Appl. No. 12/414,567, filed Mar. 30, 2009, 8 pages.

Response to Office Action Restriction dated Mar. 21, 2011, U.S. Appl. No. 12/414,567, filed Mar. 30, 2009, 7 pages.

Notice of Allowance and Fee(s) Due dated Jun. 24, 2011, U.S. Appl. No. 12/414,567, filed Mar. 30, 2009, 16 pages.

* cited by examiner

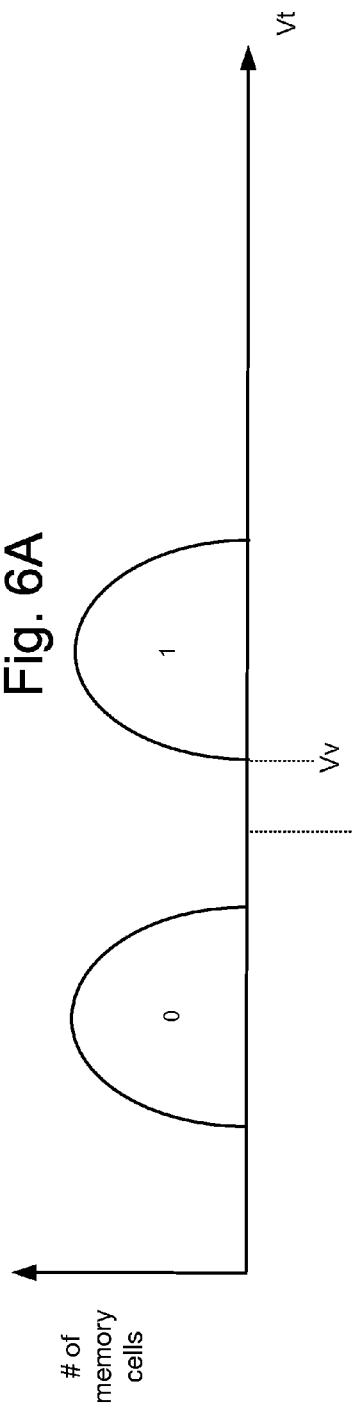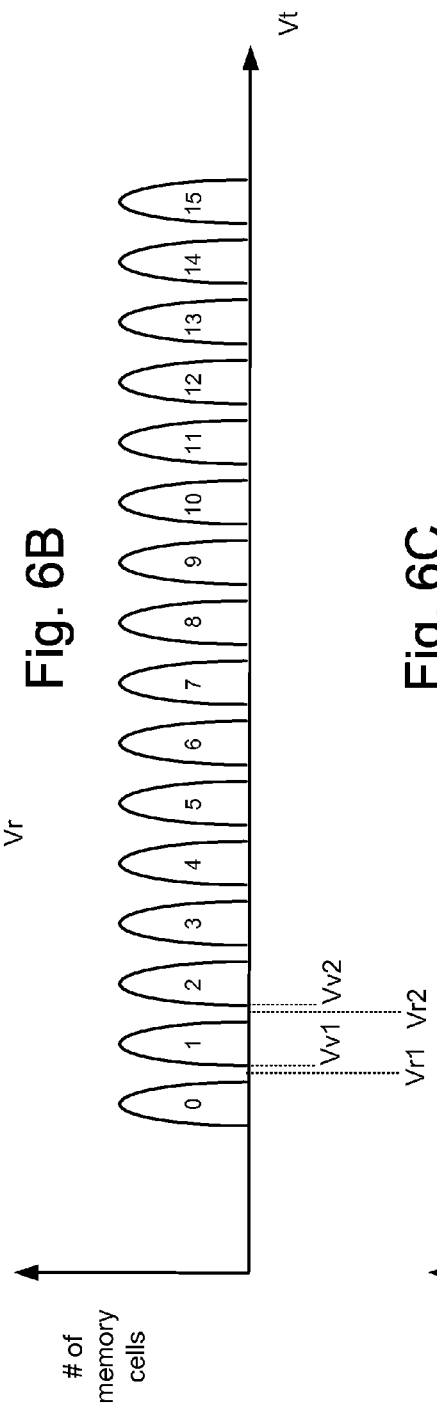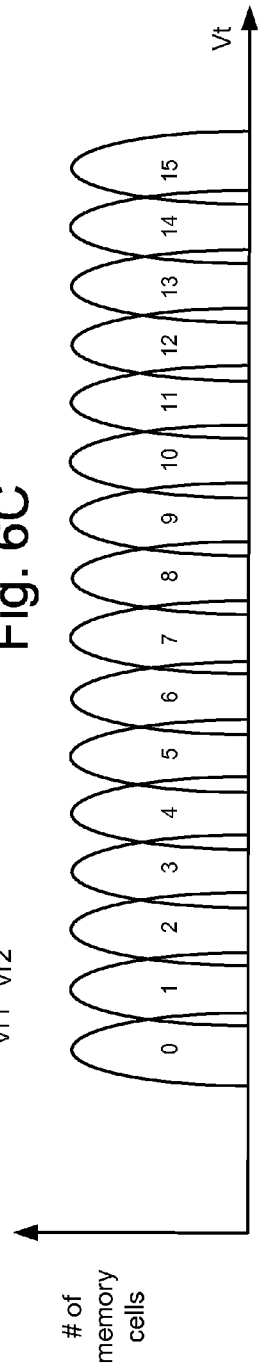

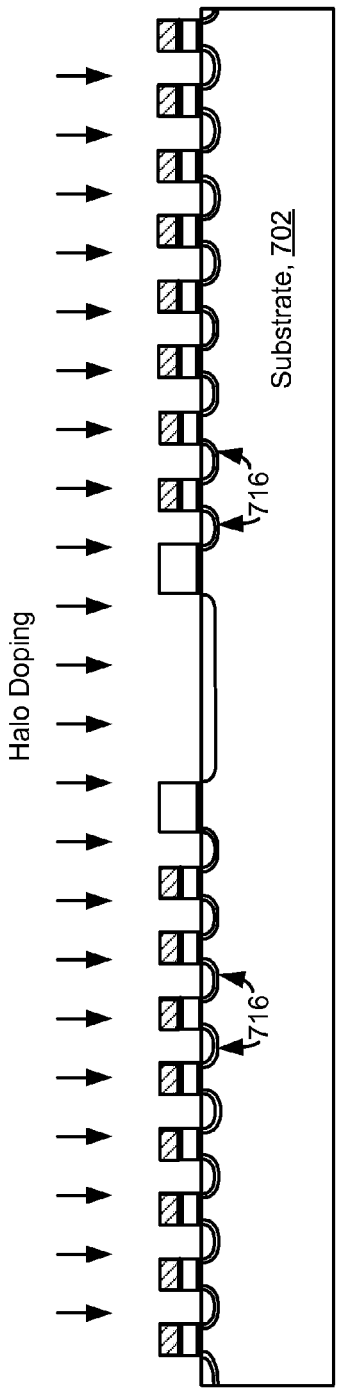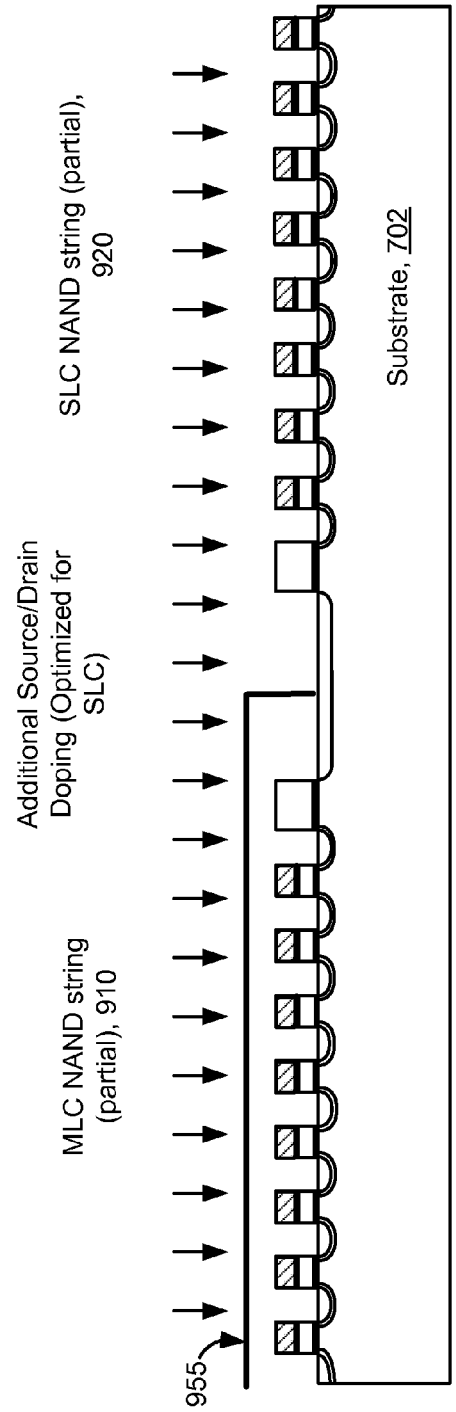

FABRICATING AND OPERATING A MEMORY ARRAY HAVING A MULTI-LEVEL CELL REGION AND A SINGLE-LEVEL CELL REGION

CLAIM OF PRIORITY

This application is a divisional application of U.S. patent application Ser. No. 12/414,567, entitled "FABRICATING AND OPERATING A MEMORY ARRAY HAVING A MULTI-LEVEL CELL REGION AND A SINGLE-LEVEL CELL REGION," filed Mar. 30, 2009, which is incorporated herein by reference in its entirety.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Some flash memory devices operate as both binary and multi-states. For example, some memory cells are used to store one bit of data ("single-level cell or SLC blocks") and other memory cells are used to store multiple bits per cell ("multi-level cell or MLC blocks"). For some devices, the SLC blocks and MLC blocks are part of the same integrated circuit, and may even be part of the same memory array. The SLC blocks may be used for short term storage of data, whereas the MLC blocks may be used for long term data storage. Thus, the SLC blocks may be programmed/erased many more times over the life of the device than MLC blocks. Therefore, endurance may be a more significant problem for SLC blocks than for MLC blocks.

On the other hand, because the MLC blocks have more states than SLC blocks, the states are packed in more closely, which leads to greater reliability problem with MLC blocks. An example of a reliability problem is program disturb, which may be experienced during programming due to the proximity of the non-volatile storage elements to one another. Program disturb occurs when the threshold voltage of a previously-programmed non-volatile storage element is shifted due to subsequent programming of other non-volatile storage elements. Because MLC blocks have more states and, therefore, have less separation between the threshold voltage of one state and the next, program disturb is a greater problem for MLC blocks then for SLC blocks.

However, it can be difficult to form SLC blocks and MLC blocks that have desired characteristics for each type of block on the same integrated circuit. For example, the process of forming the integrated circuit can be tailored to achieve high reliability for MLC blocks, but this may come at the expense of lower endurance for SLC blocks.

SUMMARY OF THE INVENTION

The present invention addresses the above and other issues by providing a non-volatile storage system, a method for forming a non-volatile storage system, and a method for operating a non-volatile storage system which provide high endurance for SLC blocks and high reliability for MLC blocks.

In one embodiment, a non-volatile storage system includes a substrate, a first region including a first plurality of non-volatile storage elements, and a second region including a second plurality of non-volatile storage elements. The non-volatile storage elements have source drain regions having a first concentration of ions and a second concentration of ions near the source/drain regions. The conductivity type of the first concentration is opposite the conductivity type of the second concentration. The second non-volatile storage elements have source drain regions having a third concentration of ions and a fourth concentration of zero or more ions near the source/drain regions. Either the first concentration of ions is less than the third concentration of ions or the second concentration of ions is greater than the fourth concentration of ions.

One embodiment is a method of forming a memory array of non-volatile storage elements. The method includes the following steps. A first region including a first plurality of floating gate stacks is formed above a substrate. The first region is for multi-level non-volatile storage elements. A second region including a second plurality of floating gate stacks is formed above the substrate. The second region is for single-level non-volatile storage elements. Ions having a first concentration are implanted in the substrate for source/drain regions in the first region. Ions having a second concentration are implanted in the substrate near the source/drain regions in the first region. The conductivity type of the first concentration of ions is opposite the conductivity type of the second concentration of ions. A third concentration of ions are implanted in the substrate for source/drain regions in the second region. A fourth concentration of zero or more ions are implanted in the substrate near the source/drain regions in the second region. Either the first concentration is less than the third concentration or the second concentration is greater than the fourth concentration.

In another aspect, a non-volatile storage system includes a first plurality of NAND strings of non-volatile storage elements in a first region of a memory array and a second plurality of NAND strings of non-volatile storage elements in a second region of the memory array. The first region is for multi-level non-volatile storage elements, and the second region is for single-level non-volatile storage elements. There are first shallow trench isolation structures that separate adjacent ones of the first plurality of NAND strings and second shallow trench isolation structures that separate adjacent ones of the second plurality of NAND strings. The first shallow trench isolation structures have a deep etch back and the second shallow trench isolation structures have a shallow etch back.

One aspect is a method of forming a memory array of non-volatile storage elements. The method includes the following steps. A first region including a first plurality of polysilicon strips to be used to form floating gates is formed above a substrate. The first region is for multi-level non-volatile storage elements. A second region including a second plurality of polysilicon strips to be used to form floating gates is formed above the substrate. The second region is for single-level non-volatile storage elements. Isolation material is deposited between adjacent ones of the first plurality of polysilicon strips and between adjacent ones of the second plurality of polysilicon strips. A shallow etch back of the isolation material is performed in the second region. A deep etch back of the isolation material is performed in the first region.

One aspect is a non-volatile storage system that includes a group of non-volatile storage elements associated with a bit line and one or more managing circuits in communication with the group of non-volatile storage elements. The one or more managing circuits reads the group of non-volatile storage elements during a first period that is associated with less than a threshold amount of use by applying a first voltage to the bit line. The one or more managing circuits reads the group of non-volatile storage elements during a second period that is associated with more than the threshold amount of use by applying a second voltage to the bit line.

One embodiment is a method of operating non-volatile storage. During a first period, a group of non-volatile storage elements associated with a bit line are read by applying a first voltage to the bit line. The first period is associated with less than a threshold amount of use. During a second period, the group of non-volatile storage elements are read by applying a second voltage to the bit line. The second period is associated with more than a threshold amount of use.

BRIEF DESCRIPTION OF THE DRAWINGS

FIG. 6A-6C depict example threshold voltage distributions.

FIG. 9A-9D depict various stages of formation of the memory array according to the process depicted in FIG. 8.

DETAILED DESCRIPTION

Techniques are disclosed herein for applying different process steps to SLC blocks than to MLC blocks such that the SLC blocks will have high endurance and the MLC blocks will have high reliability. In some embodiments, different doping is used in the MLC blocks than in the SLC blocks. In some embodiments, different isolation is used in the MLC blocks than in the SLC blocks. Techniques are disclosed herein that apply different read parameters depending on how many times a block has been programmed/erased. Therefore, blocks that have been cycled many times are read using different parameters than blocks that have been cycled fewer times.

Figure 1:
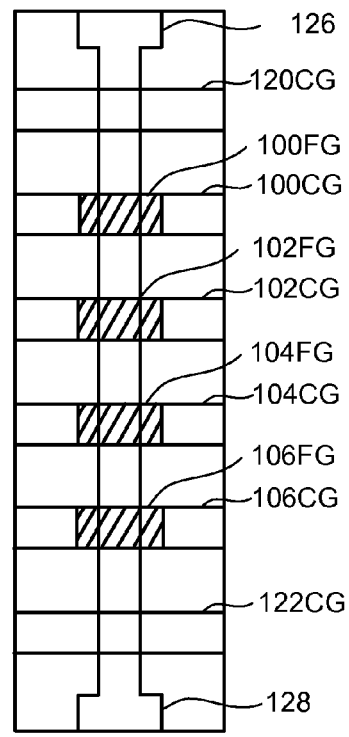
FIG. 1 is a top view of a NAND string.

The techniques described herein are applicable to wide range of memory arrays having memory cells for storing a single bit per cell and memory cells for storing multiple bits per cell. The following is one example NAND architecture. However, techniques described herein are not limited to this example. One example of a flash memory system uses the NAND structure, which includes arranging multiple floating gate transistors in series between two select gates. The transistors in series and the select gates are referred to as a NAND string. FIG. 1 is a top view showing one NAND string. The NAND string depicted in FIG. 1 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
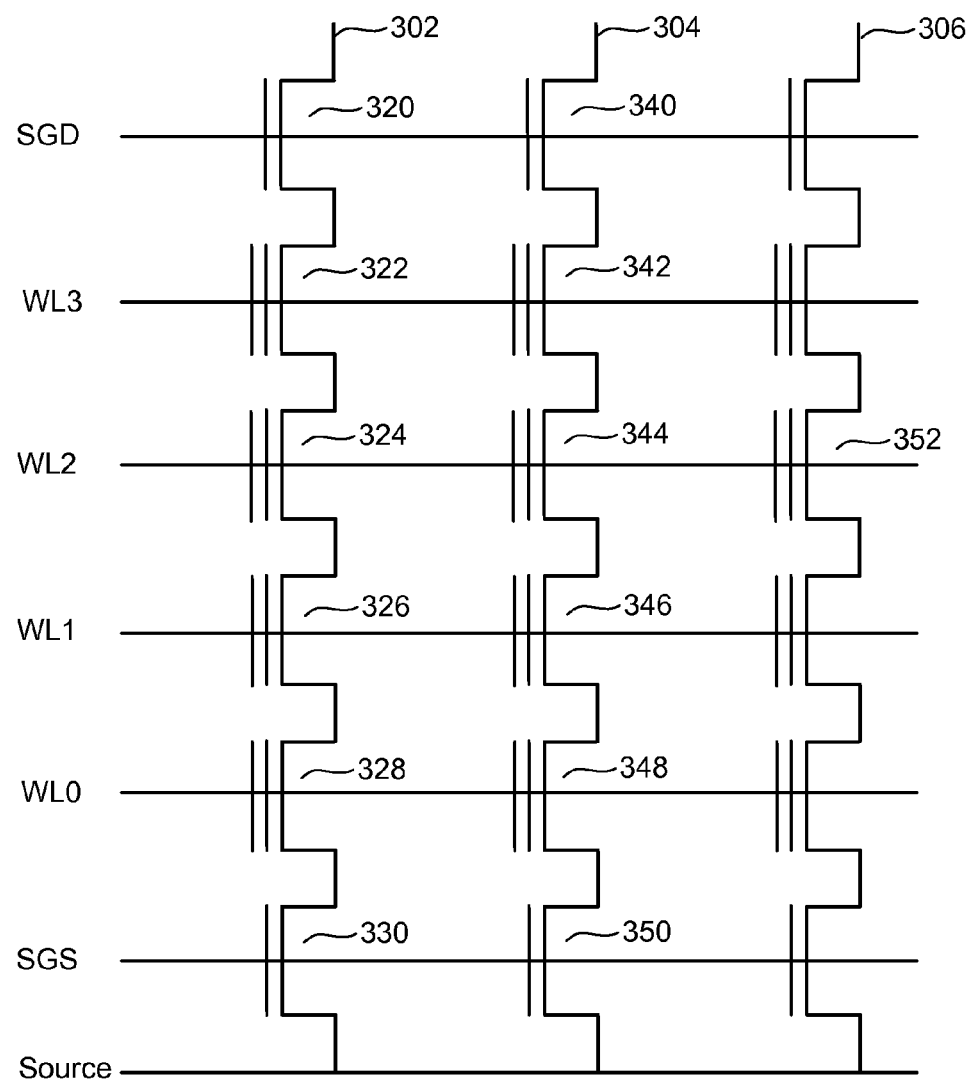
FIG. 2A is a circuit diagram of three NAND strings with associated word lines.

FIG. 2A shows three NAND strings 302, 304 and 306 of a memory array having many more NAND strings. Each of the NAND strings of FIG. 2A includes two select transistors and four memory cells. For example, NAND string 302 includes select transistors 320 and 330, and memory cells 322, 324, 326 and 328. NAND string 304 includes select transistors 340 and 350, and memory cells 342, 344, 346 and 348. Each NAND string is connected to the source line by its select transistor (e.g. select transistor 330 and select transistor 350). A selection line SGS is used to control the source side select gates. The various NAND strings are connected to respective bit lines by select transistors 320, 340, etc., which are controlled by select line SGD. In other embodiments, the select lines do not necessarily need to be in common. Word line WL3 is connected to the control gates for memory cell 322 and memory cell 342. Word line WL2 is connected to the control gates for memory cell 324, memory cell 344, and memory cell 352. Word line WL1 is connected to the control gates for memory cell 326 and memory cell 346. Word line WL0 is connected to the control gates for memory cell 328 and memory cell 348. As can be seen, each bit line and the respective NAND string comprise the columns of the array of memory cells. The word lines (WL3, WL2, WL1 and WL0) comprise the rows of the array.

Figure 2B:
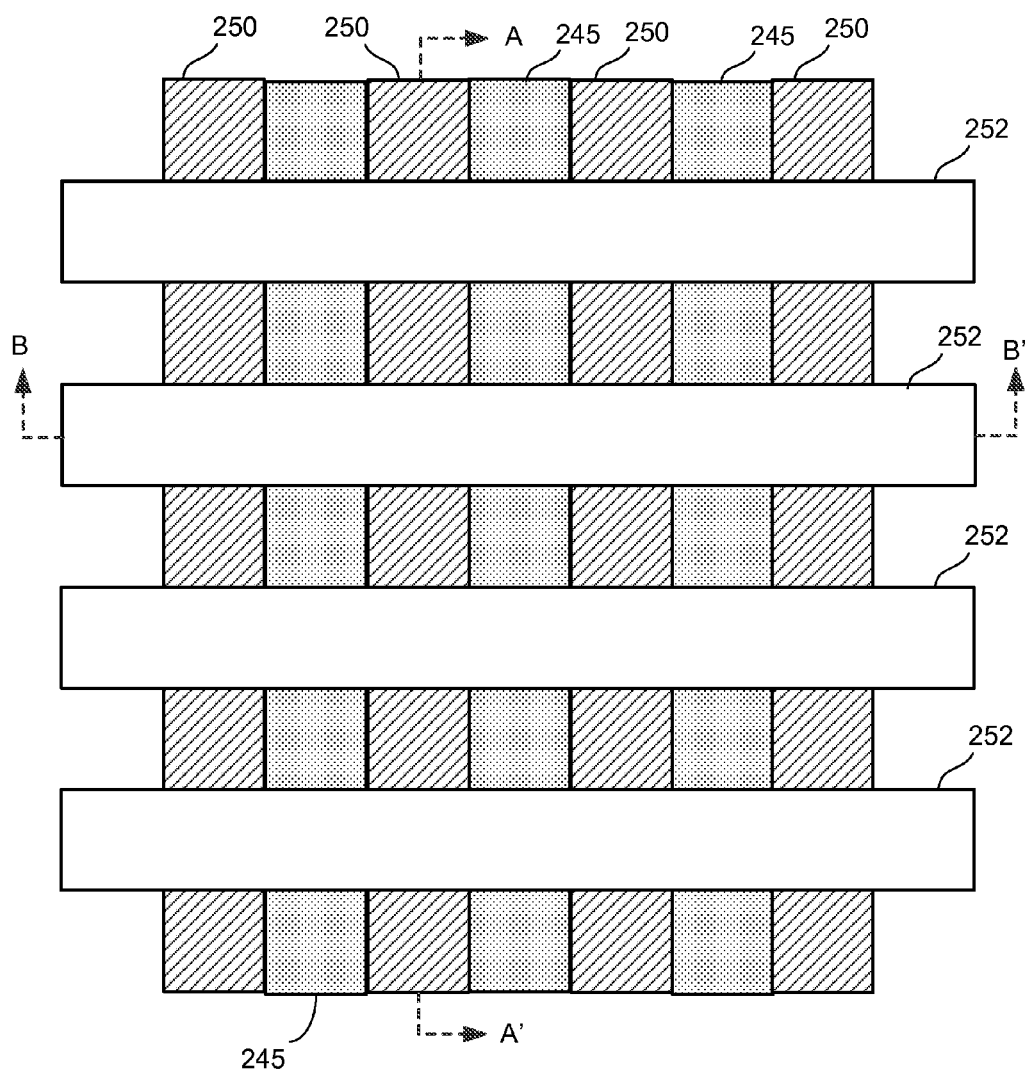
FIG. 2B is a top view of the three NAND strings and word lines.

FIG. 2B is a top view of a portion of an array of NAND flash memory cells. The array includes bit lines 250 and word lines 252. Shallow trench isolation (STI) structures 245 are depicted between the bit lines 250 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
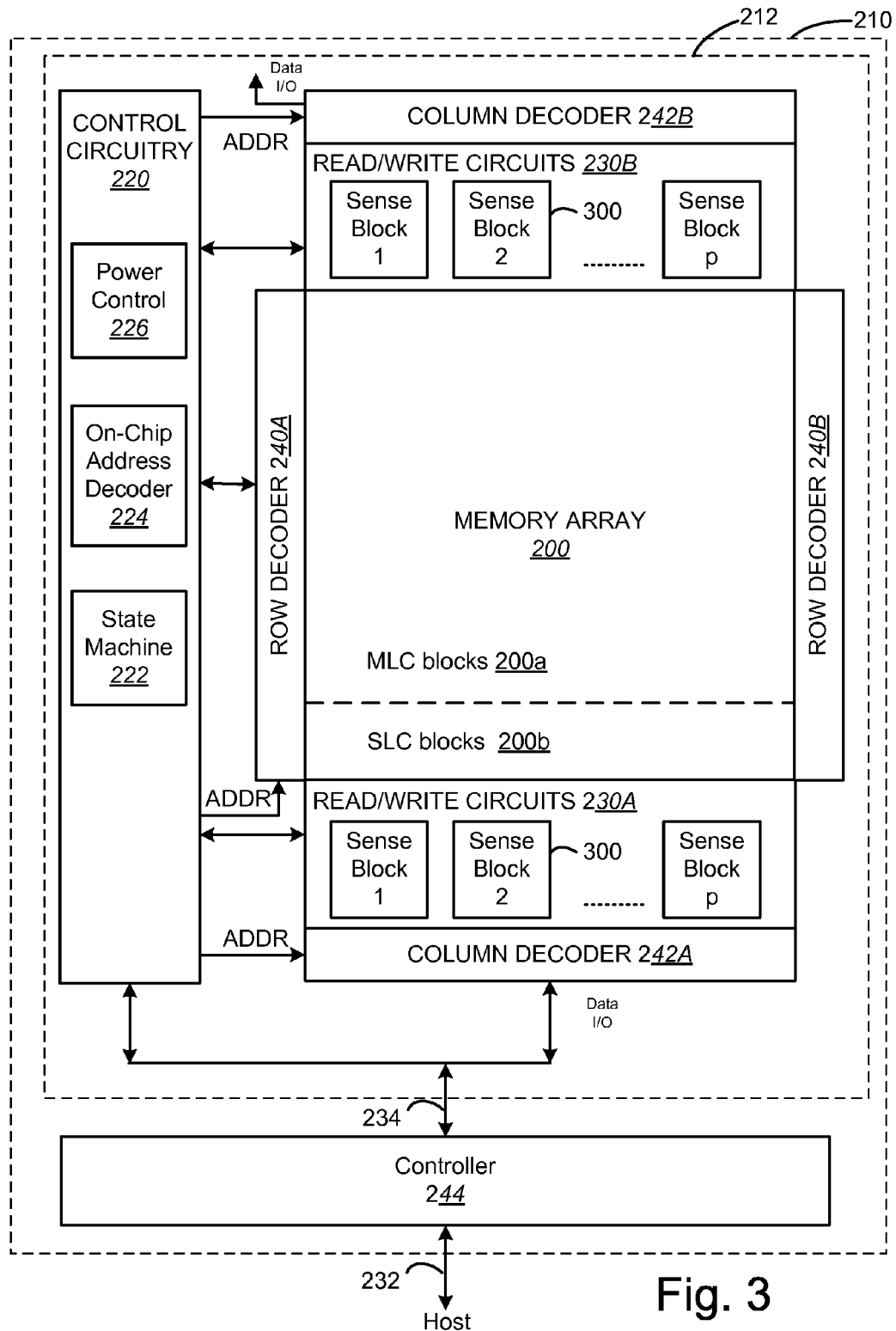
FIG. 3 is a block diagram of an array of NAND flash storage elements.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

The memory array 200 includes an MLC block region 200a and an SLC block region 200b. An SLC block and an MLC block may have the same number of memory cells for user data; however, because an MLC stores multiple bits per cell an MLC block may store 2, 4, or 8 times as much data as an SLC block. Of course, it is not required that SLC blocks and MLC blocks have the same number of memory cells. Typically, the data stored in the MLC blocks is processed with a very strong ECC algorithm in order to provide greater reliability. Such strong ECC is generally not required with SLC blocks. A region 200b of the memory array 200 having SLC blocks will be referred to as "an SLC region 200b" and a region 200b of the memory array 200 having MLC blocks will be referred to as "an MLC region 200a."

In some embodiments, when the controller 244 receives user data it is first stored in one or more SLC blocks. At some point, the controller 244 may transfer the user data stored in the SLC blocks into one or more MLC blocks. As an example, if the MLC blocks each store four times as much data as an SLC block, the controller 244 may wait until four SLC blocks are filled and then read in that data, perform strong ECC, and store the data into a single MLC block. Note that this technique may result in data being stored in MLC blocks for longer periods of time than in SLC blocks, but that is not required.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
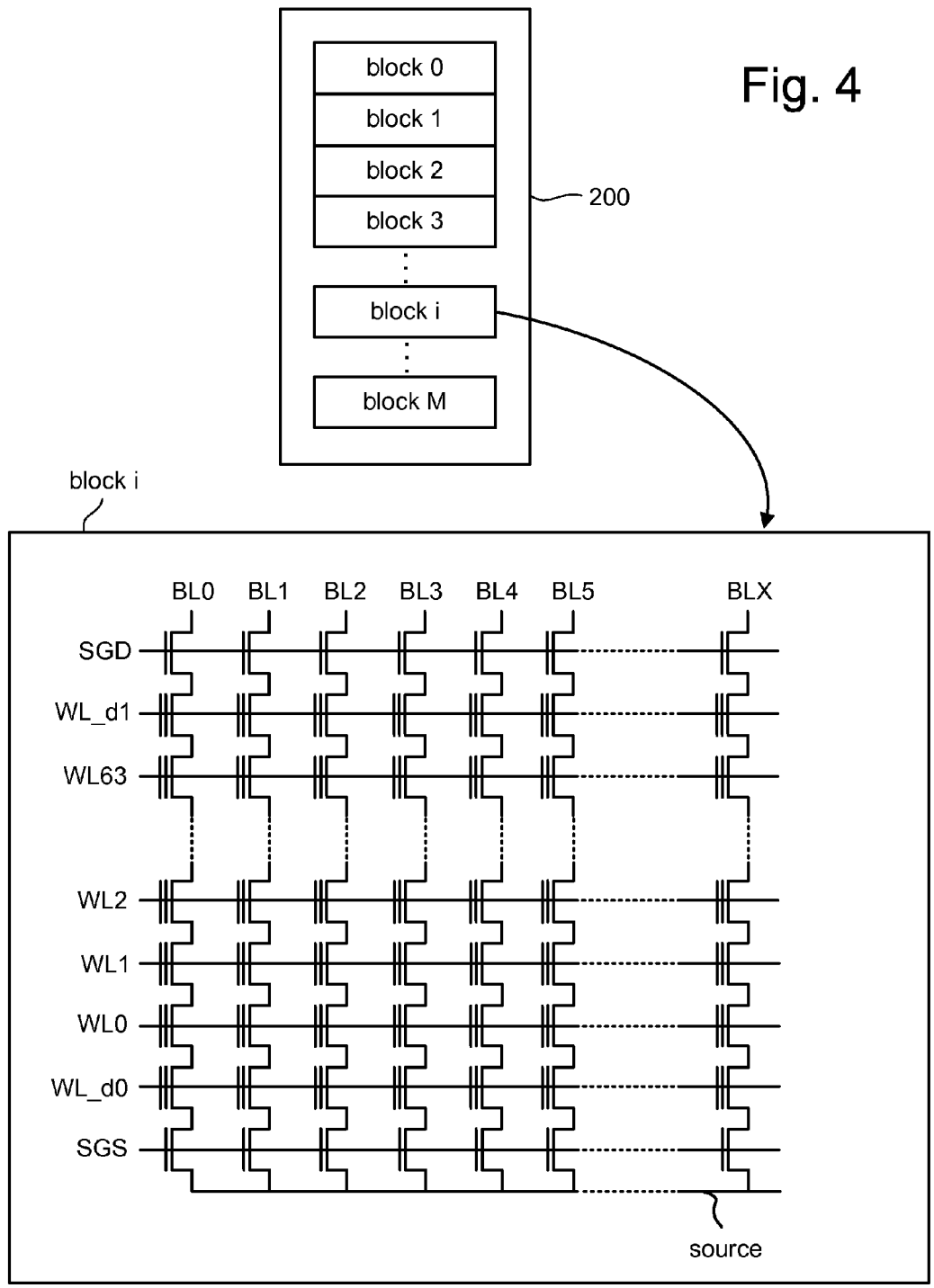
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 5:
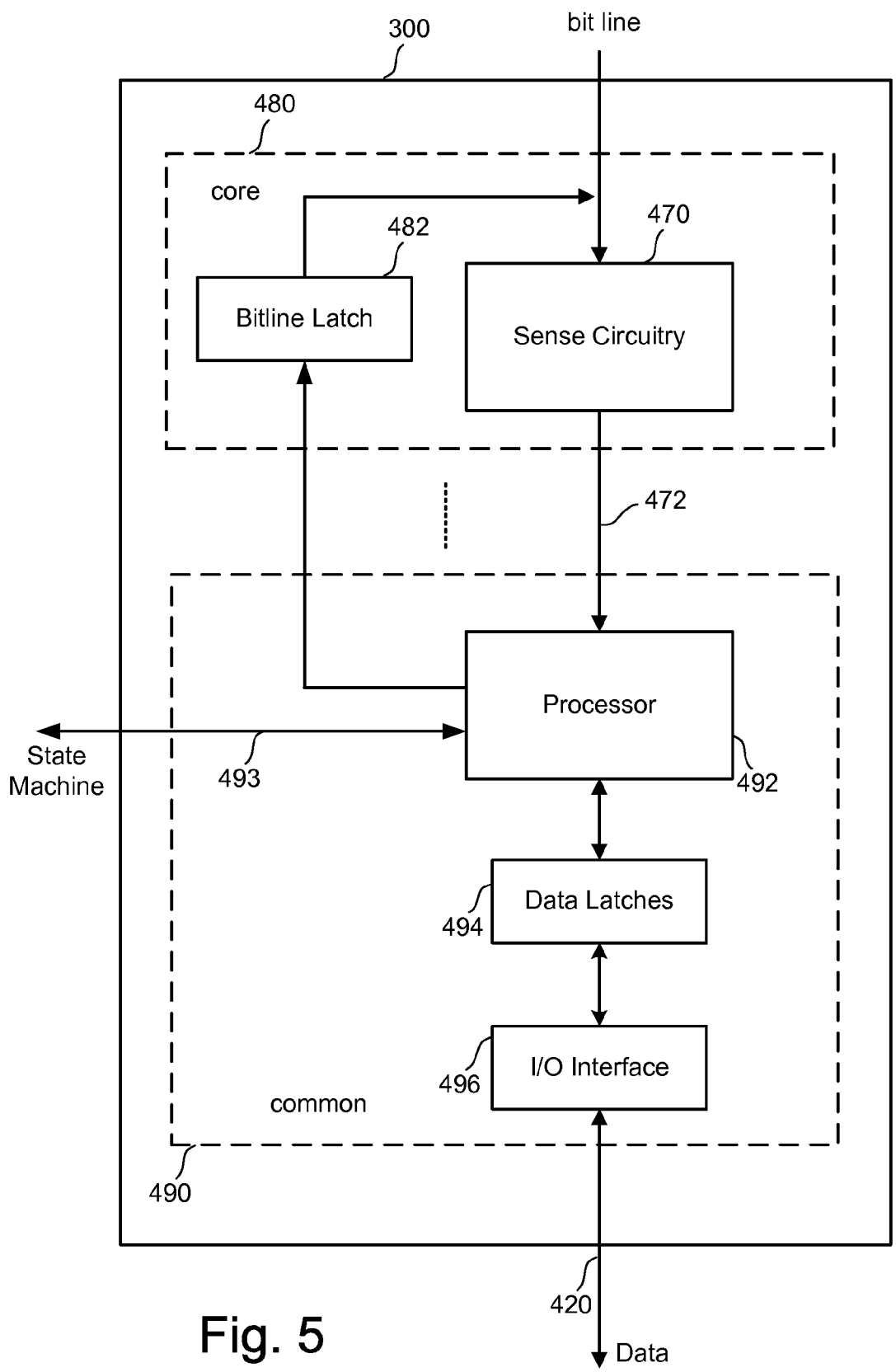
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A depicts example Vt distributions for states of memory cells in an SLC block. FIG. 6B illustrates example Vt distributions corresponding to data states for the memory cell array when each memory cell stores four bits of data. Such a distribution may be used for programming an MLC block. Other embodiments, however, may use more or less than four bits of data per memory cell. FIG. 6B shows 16 Vt distributions corresponding to data states 0-15. In some embodiments, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6B shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6B shows Vv1 for state 1 and Vv2 for state 2. When programming memory cells to a given state, the system will test whether those memory cells have a threshold voltage greater than or equal to the verify reference voltage.

FIG. 6C illustrates that another embodiment of Vt distributions corresponding to data states 0-15 can partially overlap since the correction algorithm can handle a certain percentage of cells that are in error. Also note that the Vt axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Referring again to FIG. 6A, State 0 may be an erase distribution that results from erasing all memory cells in an SLC block. The erase verification voltage is not explicitly depicted but may be just at the right edge of the erase distribution. When an SLC block is programmed, the system moves the threshold voltage of selected memory cells to distribution 1. The system verifies whether memory cells are programmed to a threshold voltage of Vv for state 1. After programming has been completed, the system reads memory cells by comparing their threshold voltage with Vr. Note that because the Vt distributions are widely separated in the SLC block that reliability is not as challenging as for an MLC block.

Figure 16:
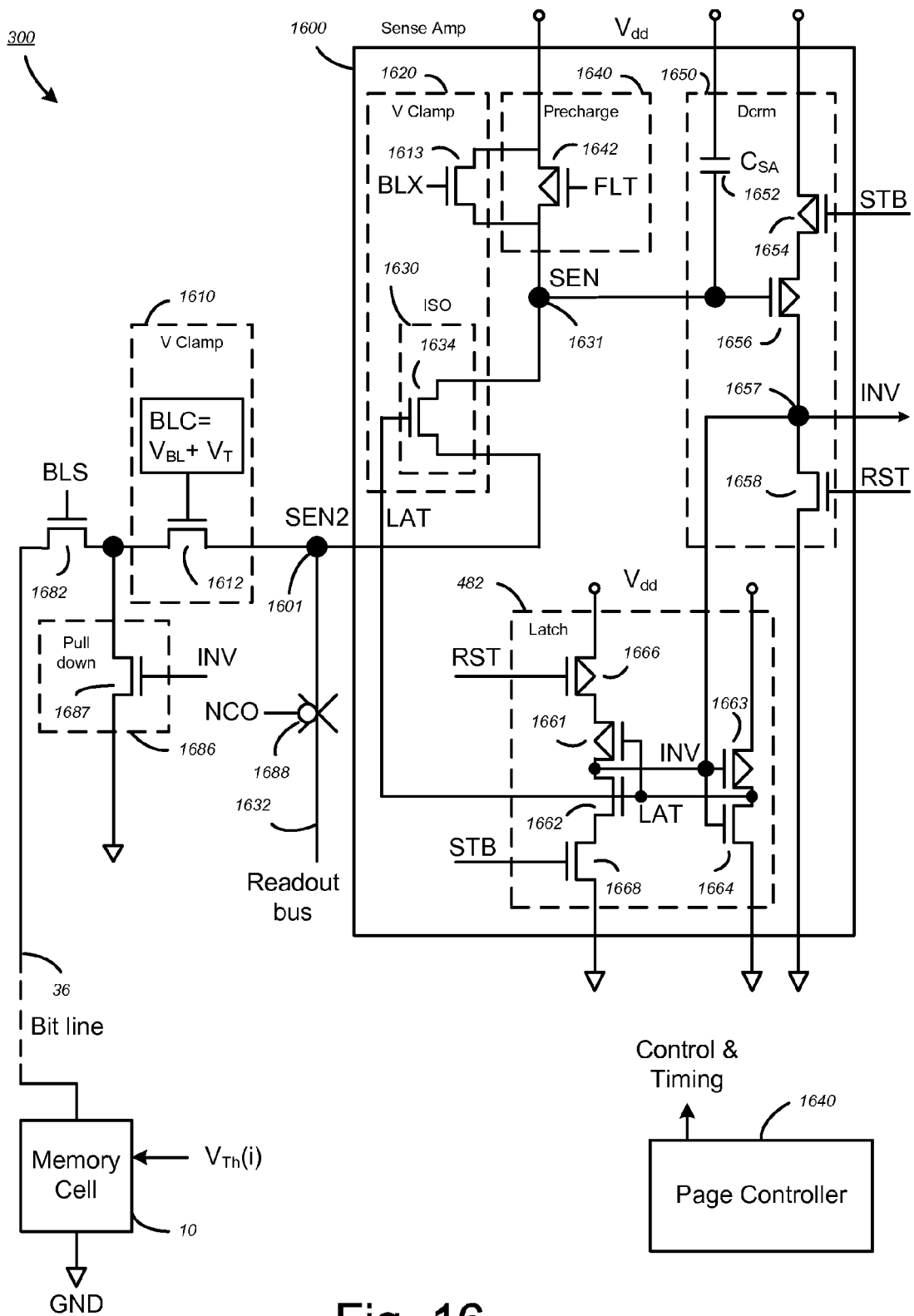
FIG. 16 illustrates an example of sense module.

FIG. 16 illustrates an example of sense module 300; however, other implementations can also be used. Sense module 300 comprises a bit line isolation transistor 1682, bit line pull down circuit 1686, bit line voltage clamp 1610, readout bus transfer gate 1688 and a sense amplifier 1600 which in this implementation contains bitline latch 482. Note that the memory cell 10 and page controller 1640 in FIG. 16 are associated with but not structurally a part of sense module 300.

In general, a page of memory cells is operated on in parallel. Therefore a corresponding number of sense modules are in operation in parallel. In one embodiment, page controller 1640 expediently provides control and timing signals to the sense modules operated in parallel.

Sense module 300 is connectable to the bit line 36 of a memory cell when the bit line isolation transistor 1682 is enabled by a signal BLS. Sense module 300 senses the conduction current of the memory cell by means of sense amplifier 1600 and latches the read result as a digital voltage level SEN2 at a sense node 1601 and outputs it to a readout bus 1632 via readout bus transfer gate 1688.

The sense amplifier 1600 essentially comprises a second voltage clamp 1620, a precharge circuit 1640, a discriminator or compare circuit 1650 and a latch 482. The discriminator circuit 1650 includes a dedicated capacitor 1652. In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN 1631 to decrease, effectively charging or increasing the voltage across capacitor 1652 whose other terminal is at Vdd. If the voltage on node SEN discharges to a predetermined level during a predetermined sensing period, then sense amplifier 1600 reports that the memory cell turned on in response to the control gate voltage.

One feature of the sense module 300 is the incorporation of a constant voltage supply to the bit line during sensing. This is preferably implemented by the bit line voltage clamp 1610. The bit line voltage clamp 1610 operates like a diode clamp with transistor 1612 in series with the bit line 36. Its gate is biased to a constant voltage BLC equal to the desired bit line voltage VBL above its threshold voltage VT. In this way, it isolates the bit line from the sense node 1601 and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors. Techniques are disclosed herein for adjusting the bit line voltage as a function of usage of the device. In some embodiments, the bit line voltage is increased based on the number of program/erase cycles.

The sense amplifier 1600 senses the conduction current through the sense node 1601 and determines whether the conduction current is above or below a predetermined value. The sense amplifier outputs the sensed result in a digital form as the signal SEN2 at the sense node 1601 to the readout bus 1632.

The digital control signal INV, which is essentially an inverted state of the signal SEN2 after read, is also output to control the pull down circuit 1686. When the sensed conduction current is higher than the predetermined value, INV will be HIGH and SEN2 will be LOW. This result is reinforced by the pull down circuit 1686. Pull down circuit 1686 includes an n-transistor 1687 controlled by the control signal INV.

FIGS. 17(A)-17(K) illustrate the timing of the sense module 300 shown in FIG. 16. An additional description of the operation of the sense module in regards to other features has been described in U.S. patent application Ser. No. 10/254,830, "Non-Volatile Memory And Method With Reduced Source Line Bias Errors," filed on Sep. 24, 2002, by Raul-Adrian Cernea and Yan Li, published on Mar. 25, 2004 as Pub. App. No. 2004/0057287; and U.S. patent application Ser. No. 10/665,828, "Non-Volatile Memory And Method with Improved Sensing," filed on Sep. 17, 2003, by Raul-Adrian Cernea and Yan Li, published on Jun. 10, 2004 as Pub. App. No. 2004/0109357. The entire disclosure of these two referenced applications are hereby incorporated herein by reference in their entirety.

Additional operation and timing of the sense module 300 during read/verify operations will be discussed with respect to the timing diagrams FIGS. 17(A)-17(K), which are demarcated into PHASES (1)-(9).

PHASE (0): Setup

The sense module 300 (see FIG. 16) is connected to the bit line 36 via an enabling signal BLS (FIG. 17(A)). The Voltage clamp is enabled with BLC (FIG. 17(B)). The Precharge circuit 1640 is enabled as a limited-current source with a control signal FLT (FIG. 17(C)).

PHASE (1): Controlled Precharge

Sense amplifier 1600 is initialized by a reset signal RST (FIG. 17(D)) which will pull the signal INV to ground via the transistor 1658. Thus, on reset, INV is set to LOW. At the same time, a p-transistor 1663 pulls a complementary signal LAT to $V_{dd}$ or HIGH (FIG. 17(H)).

Isolation gate 1630 is formed by an n-transistor 1632, which is controlled by the signal LAT. Thus, after reset, the isolation gate is enabled to connect sense node 1601 to the sense amplifier's internal sense node 1631, and the signal SEN2 will be the same as the signal SEN at the internal sense node 1631.

The precharge circuit 1640 precharges the bit line 36 through the internal sense node 1631 and the sense node SEN2 1601 for a predetermined period of time. This will bring the bit line to an optimal voltage for sensing the conduction therein.

The precharge circuit 1640 includes a pull-up p-transistor 1642 controlled by the control signal FLT ("FLOAT"). The bit line will be pulled up towards the desired bit line voltage as set by the bit line voltage clamp 1610. The rate of pull-up will depend on the conduction current in the bit line. The smaller the conduction current, the faster the pull-up.

Precharge circuit 1640 is implemented to serve two functions. One is to precharge the bit line to an optimal sensing voltage. The other is to help identify those memory cells with conduction currents higher than a predetermined value for D.C. (Direct Current) sensing so that they may be eliminated from contributing to source line bias.

The D.C. sensing is accomplished by providing a precharge circuit that behaves like a current source for supplying a predetermined current to the bit line. The signal FLT that controls the p-transistor 1642 is such that it "programs" a predetermined current to flow through the precharge circuit 1640. As an example, the FLT signal may be generated from a current mirror with a reference current set to 500 nA. When the p-transistor 1642 forms the mirrored leg of the current mirror, it will also have the same 500 nA throwing in it.

Figure 17:
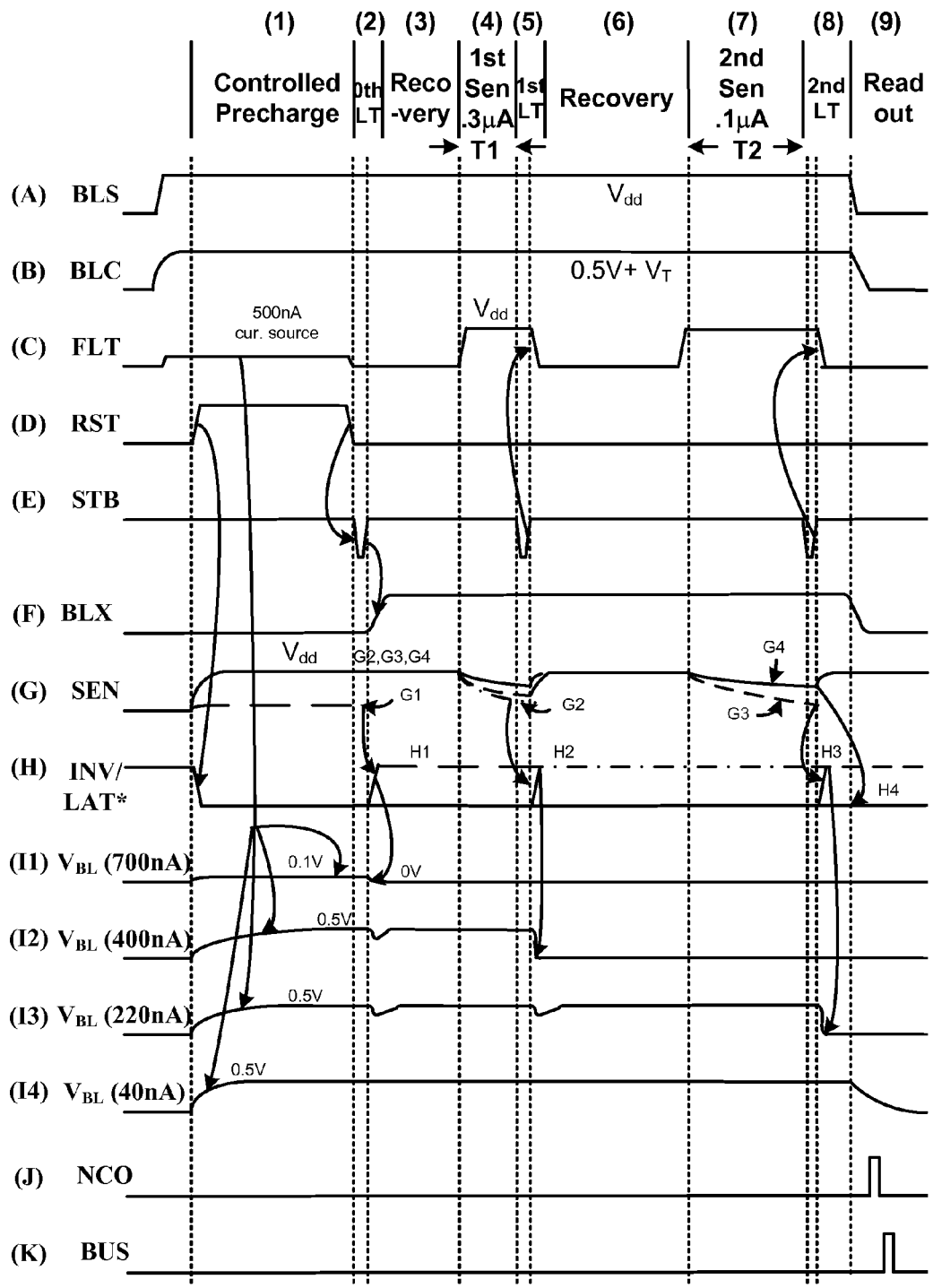
FIGS. 17(A)-17(K) illustrate the timing of the sense module shown in FIG. 16.

FIGS. 17(I1)-17(I4) illustrate the voltages on four example bit lines connected respectively to memory cells with conduction currents of 700 nA, 400 nA, 220 nA and 40 nA. When the precharge circuit 1640 is a current source with a limit of 500 nA, for example, a memory cell having a conduction current exceeding 500 nA will have the charges on the bit line drained faster than it can accumulate. Consequently, for the bit line with conduction current 700 nA, its voltage or the signal SEN at the internal sense node 1631 will remain close to 0V (such as 0.1 volt; see FIG. 17(I1)). On the other hand, if the memory cell's conduction current is below 500 nA, the precharge circuit 1640 will begin to charge up the bit line and its voltage will begin to rise towards the clamped bit line voltage (e.g., 0.5V set by the voltage clamp 1610) (FIGS. 17(I2)-17(I4)). Correspondingly, the internal sense node 1631 will either remain close to 0V or be pulled up to $V_{dd}$ (FIG. 17(G)). Generally, the smaller the conduction current, the faster the bit line voltage will charge up to the clamped bit line voltage. Thus, by examining the voltage on a bit line after the controlled precharge phase, it is possible to identify if the connected memory cell has a conduction current higher or lower than a predetermined level.

PHASE (2): D.C. Latching & Removing the High Current Cells from Subsequent Strobes After the controlled precharge phase, an initial D.C. high-current sensing phase begins where the signal SEN is sensed by the discriminator circuit 1650. The sensing identifies those memory cells with conduction currents higher than the predetermined level. The discriminator circuit 1650 includes two p-transistors 1654 and 1656 in series, which serve as a pull up for a node 1657 registering the signal INV. The p-transistor 1654 is enabled by a read strobe signal STB going LOW and the p-transistor 1656 is enabled by the SEN signal at the internal sense node 1631 going LOW. High current memory cells will have the signal SEN close to 0V or at least unable for its bit lines to be precharged sufficiently high to turn off the p-transistor 1656. For example, if the weak pull up is limited to a current of 500 nA, it will fail to pull up a cell with conduction current of 700 nA (FIG. 17(G1)). When STB strobes LOW to latch, INV at the node 1657 is pulled up to $V_{dd}$. This will set the latch circuit 482 with INV HIGH and LAT LOW (FIG. 17(H1)).

When INV is HIGH and LAT LOW, the isolation gate 1630 is disabled and the sense node 481 is blocked from the internal sense node 1631. At the same time, the bit line is pulled to ground by the pull down circuit 1686 (FIGS. 16 & 17(I1)). This will effectively turn off any conduction current in the bit line, eliminating it from contributing to source line bias.

Thus, in one preferred implementation of the sense module 300, a limited-current source precharge circuit is employed. This provides an additional or alternative way (D.C. sensing) to identify bit lines carrying high currents and to turn them off to minimize source line bias error in subsequent sensing.

In another embodiment, the precharge circuit is not specifically configured to help identify high current bit lines but is optimized to pull up and precharge the bit line as fast as possible within the allowance of the maximum current available to the memory system.

PHASE (3): Recovery/Precharge

Prior to a sensing of the conduction current in a bit line that has not been previously pulled down, the precharge circuit is activated by the signal FLT going LOW to precharge the internal sense node 1631 to $V_{dd}$ (FIG. 17(C) and FIGS. 17(I2)-17(I4)) and the bit line which may have been partially coupled down due to a decrease in the voltage on adjacent bit lines.

PHASE (4): First A.C. Sensing

In one embodiment, an A.C. (Alternating Current or transient) sensing is performed by determining the voltage drop at the floated internal sense node 1631. This is accomplished by the discriminator or compare circuit 1650 employing the capacitor $C_{SA}$ 1652 coupled to the internal sense node 1631, and considering the rate the conduction current is charging it (reducing the voltage on node SEN). In an integrated circuit environment, the capacitor 1652 is typically implemented with a transistor; however, other implementations are suitable. Capacitor 1652 has a predetermined capacitance, e.g., 30 fF, which can be selected for optimal current determination. The demarcation current value, typically in the range of 100-1000 nA, can be set by appropriate adjustment of the charging period.

The discriminator circuit 1650 senses the signal SEN in the internal sense node 1631. Prior to each sensing, the signal SEN at the internal sense node 1631 is pulled up to $V_{dd}$ by the precharge circuit 1640. This will initially set the voltage across the capacitor 1652 to be zero.

When the sense amplifier 1600 is ready to sense, the precharge circuit 1640 is disabled by FLT going HIGH (FIG. 17(C)). The first sensing period T1 is ended by the assertion of the strobe signal STB. During the sensing period, a conduction current induced by a conducting memory cell will charge the capacitor. The voltage at SEN will decrease from $V_{dd}$ as the capacitor 1652 is charged through the draining action of the conduction current in the bit line. FIG. 17(G) (see curves G2-G4) illustrates the SEN signal corresponding to the remaining three example bit lines connected respectively to memory cells with conduction currents of 400 nA, 220 nA and 40 nA, the decrease being more rapid for those with a higher conduction current.

PHASE (5): First A.C. Latching and Removal of Higher Current Cells from Subsequent Sensing At the end of the first predetermined sensing period, SEN will have decreased to some voltage depending on the conduction current in the bit line (see curves G2-G4 of FIG.

17G). As an example, the demarcation current in this first phase is set to be at 300 nA. The capacitor $C_{SA}$ 1652, the sensing period T1 and the threshold voltage of the p-transistor 1656 are such that the signal SEN corresponding to a conduction current higher than the demarcation current (e.g., 300 nA) will drop sufficiently low to turn on the transistor 1656 in the discriminator circuit 1650. When latching signal STB strobes LOW, the output signal INV will be pulled HIGH, and will be latched by the latch 482 (FIG. 17(E) and FIG. 17(H) (curve H2)). On the other hand, the signal SEN corresponding to a conduction current below the demarcation current will produce a signal SEN unable to turn on the transistor 1656. In this case, the latch 482 will remain unchanged, in which case LAT remains HIGH (FIGS. 17(H3) and 17(H4)). Thus, it can be seen that the discriminator circuit 1650 effectively determines the magnitude of the conduction current in the bit line relative to a reference current set by the sensing period.

Sense amplifier 1600 also includes the second voltage clamp 1620 whose purpose is to maintain the voltage of the drain of the transistor 1613 sufficiently high in order for the bit line voltage clamp 1610 to function properly. As described earlier, the bit line voltage clamp 1610 clamps the bit line voltage to a predetermined value $V_{BL}$, e.g., 0.5V that is a function of device usage. This will require the gate voltage BLC of the transistor 1612 to be set at $V_{BL}+V_T$ (where $V_T$ is the threshold voltage of the transistor 1612) and the drain connected to the sense node 1601 to be greater than the source, i.e., the signal SEN2>$V_{BL}$. In particular, given the configurations of the voltage clamps 1610 and 1620, SEN2 should be no higher than the smaller of LAT−$V_T$ or BLX−$V_T$, and SEN should be no lower. During sensing, the isolation gate 1630 is in a pass-through mode. However, during sensing the signal SEN at the internal sense node 1631 has a voltage that decreases from $V_{dd}$. The second voltage clamp 1620 prevents SEN from dropping below LAT−$V_T$ or BLX−$V_T$, whichever is lower. This is accomplished by an n-transistor 1613 controlled by a signal BLX, where BLX is $\geq V_{BL}+V_T$ (FIG. 17(F)). Thus, through the actions of the voltage clamps 1610 and 1620, the bit line voltage $V_{BL}$ is kept constant, e.g., ~0.5V, during sensing for a particular read or verify.

In another embodiment, the current determination is accomplished by comparison with a reference current, which may be provided by the conduction current of a reference memory cell. This could be implemented with the compare current as part of a current mirror.

The output of the current determination is latched by the latch circuit 482. The latch circuit is formed as a Set/Reset latch by the transistors 1661, 1662, 1663 and 1664 together with the transistors 1666 and 1668. The p-transistor 1666 is controlled by the signal RST (RESET) and the n-transistor 1668 is controlled by the signal STB. A variation of the above-described sense amplifier that is adapted for low voltage operation is found in U.S. patent application Ser. No. 11/015,199 titled "Improved Memory Sensing Circuit And Method For Low Voltage Operation," Inventor Raul-Adrian Cernea, filed on Dec. 16, 2004, incorporated herein by reference in its entirety.

In general, there will be a page of memory cells being operated on by a corresponding number of multi-pass sense modules 300. For those memory cells having conduction current higher than the first demarcation current level, their LAT signal will be latched LOW (INV latched HIGH). This in turn activates the bit line pull down circuit 1686 to pull the corresponding bit lines to ground, thereby turning off their currents.

PHASE (6): Recovery/Precharge

Prior to the next sensing of the conduction current in a bit line such as bit line 36 that has not been previously pulled down, the precharge circuit is activated by the signal FLT to precharge the internal sense node 1631 to $V_{dd}$ (FIG. 17(C)(6) and FIGS. 17(I3)(6)-17(I4)(6)).

PHASE (7): Second Sensing

When the sense amplifier 1600 is ready to sense, the precharge circuit 1642 is disabled by FLT going HIGH (FIG. 17(C)). The second sensing period T2 is set by the assertion of the strobe signal STB. During the sensing period, a conduction current, if any, will charge the capacitor. SEN will decrease from $V_{dd}$ as the capacitor 1652 is charging through the draining action of the conduction current in the bit line 36.

In accordance with the example before, the memory cells with conduction currents higher than 300 nA have already been identified and shut down in the earlier phases. FIG. 17(G) (curves G3 and G4) illustrate respectively the SEN signal corresponding to the two example bit lines connected respectively to memory cells with conduction currents of 220 nA and 40 nA.

PHASE (8): Second Latching for Reading Out

At the end of the second predetermined sensing period T2, SEN will have decreased to some voltage depending on the conduction current in the bit line 36 (FIG. 17(G) (curves G3 and G4)). As an example, the demarcation current in this second phase is set to be at 100 nA. In this case, the memory cell with the conduction current 220 nA will have its INV latched HIGH (FIG. 17(H)) and its bit line subsequently pulled to ground (FIG. 17(I3)). On the other hand, the memory cell with the conduction current 40 nA will have no effect on the state of the latch, which was preset with LAT HIGH.

PHASE (9): Read Out to the Bus

Finally, in the read out phase, the control signal NCO at the transfer gate 1688 allows the latched signal SEN2 to be read out to the readout bus 1632 (FIGS. 17(J) and 17(K)).

As can be seen from FIGS. 17(I1)-17(I4), the bit line voltage remains constant during each sensing period. Thus, from the discussion earlier, capacitive bit-line to bit-line coupling is eliminated.

The sense module 300 described above is one embodiment where sensing is performed with three passes, the first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes, some using only two or more A.C. passes, or only one pass. For the different passes, the demarcation current value used may be the same each time or converge progressively towards the demarcation current used in the final pass.

Embodiments disclosed herein adjust the bit line voltage during a read operation based on use of the memory blocks. In one embodiment, usage is based on a cycle count that may be maintained for each block. In one embodiment, the programming cycle includes the actions of programming and erasing (or erasing and then programming). In other embodiments, the programming cycle can include programming without erasing. As an example, after 10,000 cycles the bit line voltage during a read is increased by an amount such as 0.1 or 0.2 V. After 30,000 cycles the bit line voltage during a read is increased by another 0.1 or 0.2 V. The increase does not need to be the same for 30,000 cycles as for 10,000 cycles. In one embodiment, a measurement of Icell is made to determine a suitable increase in the bit line read voltage during read operations.

Figure 7:
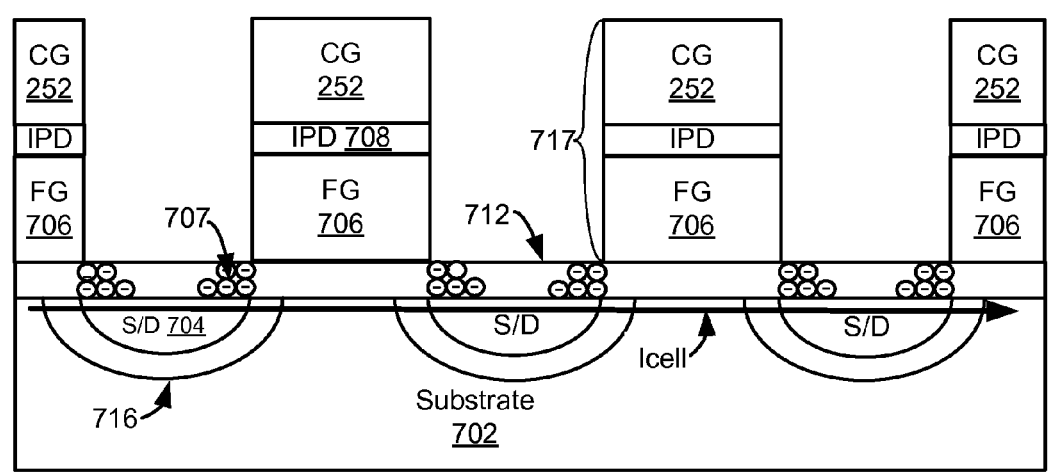
FIG. 7 depicts a portion of a NAND string over a substrate.

When memory cells undergo many erase/program cycles, charge may become trapped in the portion of the tunnel oxide layer 712 just to the right and left of floating gates 706. FIG. 7 depicts a portion of a NAND string over a substrate 702. FIG. 7 is a perspective view along a portion of the line A-A in FIG. 2B. The NAND string includes a number of floating gates stacks 717, each of which includes a floating gate 706 (FG), inter poly dielectric 708 (IPD), and control gate 252 (CG). A thin tunnel oxide layer 712 resides on top of the substrate 702. Source/drain regions 704 (S/D) formed of implanted impurity ions are depicted in the substrate 702. Halo implant regions 706 are depicted around the source/drain regions 704. The halo implant regions 716 are formed of impurity ions having the opposite conductivity as the impurity ions used to form source/drains 704. The halo implants 716 may help to reduce short channel effects. Application of a voltage to a control gate 252 may cause formation of a conductive channel (not depicted in FIG. 7) in the portion of the substrate 702 just beneath the floating gate 706. Thus, a current "Icell" may flow from one channel to the next via the source/drain regions 704.

Over time, as a result of programming and erasing the memory cells, charge may become trapped in the tunnel oxide layer 712 above the substrate 702 to the left and right of the floating gates 706. Each time that the memory cell is programmed, the programming voltage that is applied to the control gate 252 (or word line) causes electrons from the channel to be injected into the floating gate 706. When electrons accumulate in the floating gate 706, the floating gate 706 becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety. However, undesirably some electrons may also be injected into the tunnel oxide layer 712 to the right and left of the floating gate 706 as a result of the program voltage. Specifically, trapped charge 707 is depicted in the tunnel oxide layer 712 on each side of a floating gate 706.

When the memory cells are erased, the electrons are removed from the floating gates 706. However, erasing the memory cells may not be completely effective at removing the electrons in the tunnel oxide layer 712 to the right and left of the floating gate 706. Over time, this trapped charge 707 accumulates. Following is a brief description of erasing a memory cell to help illustrate why the charge becomes trapped. The storage elements are erased in one embodiment by raising a p-well (not depicted in FIG. 7) to an erase voltage (e.g., 20 V) for a sufficient period of time and grounding the word lines (CG) 252 of a selected block while the source and bit lines are floating. Due to capacitive coupling, unselected word lines, bit lines, and select lines are raised to a significant fraction of the erase voltage. A strong electric field is thus applied to the tunnel oxide layers 712 of selected storage elements and the data of the selected storage elements are erased as electrons of the floating gates 706 are emitted to the substrate 702 side, typically by Fowler-Nordheim tunneling mechanism. As electrons are transferred from the floating gate 706 to the p-well region, the threshold voltage of a selected storage element is lowered. Erasing can be performed on the entire memory array, separate blocks, or another unit of storage elements. However, as already noted the erase process may not be completely effective at removing the trapped charge 707.

Moreover, the trapped charge 707 can be detrimental to memory cell performance during read operations. As previously discussed, when reading a given memory cell on the NAND string, a read voltage is applied to the memory cell being read and a read pass voltage (a voltage that will turn on the memory cell regardless of its programmed state) is applied to all other memory cells. If the memory cell that is being read turns on in response to the read voltage, a conduction current referred to in FIG. 7 as "Icell" will conduct along the NAND string. In other words, Icell is a function of how strongly the memory cell being read conducts a current in response to the read voltage. As already discussed, by comparing the magnitude of Icell with a reference current, it can be determined whether the memory cell being read turned on or not. Based on Vread, the threshold voltage of the memory cell, and hence its programmed state, can be determined.

However, the trapped charge 707 may increase the resistance along the NAND string, which will decrease Icell (the conduction current). Since the trapped charge 707 increases with the number of erase/program cycles, the NAND string resistance tends to increase over time. As a result, a memory cell with the same actual threshold voltage may appear to have a smaller Icell over time. Consequently, the memory cell may appear to have a greater threshold voltage. That is, it may take a greater read voltage to cause Icell to equal a reference current (or demarcation current). Thus, the ability to accurately measure the programmed state of a memory cell can degrade with increasing cycle count.

Note that the trapped charge 707 may be more a significant problem for an SLC block than for an MLC block because SLC blocks endure more erase/program cycles. Also note that the extent to which the trapped charge 707 impacts the NAND string resistance may be a function of the level of doping in the source/drain regions 704. If the source/drain regions 704 are lightly doped, the NAND string resistance may be more susceptible to trapped charge 707 than if the source/drain regions 704 are more heavily doped. Techniques are disclosed herein for doping the source/drains 704 in the SLC region 200b differently from in the MLC region 200a, in order to improve the endurance of the SLC blocks while providing for high reliability of MLC blocks. In some embodiments, the source/drain regions 704 in the SLC region 200b are doped more heavily than the source/drain regions 704 in the MLC region 200a. This doping strategy reduces or eliminates the foregoing problem of increase of Icell over time in the SLC region 200b.

Note that the blocks in the MLC region 200a may not need to endure as many program/erase cycles, and hence may not be subject to the same degree of increase of Icell over time. Moreover, increasing the doping of the source/drain regions 704 may lead to short channel effects. That is, increased doping levels may cause the source/drain regions 704 to extend somewhat into the channel region below the floating gate 704. The MLC blocks may be more sensitive to the short channel effects than SLC blocks. Therefore, having too much source/drain doping in the MLC region 200a may be undesirable.

Furthermore, increased source/drain doping may negatively impact the ability to achieve channel boosting. Boosting techniques attempt to boost the channel area of a NAND string that is inhibited from programming to a high potential while connecting the channel area of a NAND string that contains a storage element to be programmed to a low potential such as 0 V. For example, an erased area self boosting (EASB) technique isolates the boosted channels by applying a sufficiently low voltage, typically 0 V, on one unselected word line of the NAND string, in between the programmed and erased areas, while applying a high pass voltage such as 8 V on the other unselected word lines. Revised EASB (REASB) is similar to EASB but applies a small voltage such as 2.5 V to an adjacent isolation word line. Note that channel boosting may be more beneficial in the MLC region 200a than in the SLC region 200b. Therefore, it could be beneficial to have less source/drain doping in the MLC region 200a than the SLC region 200b.

A further consideration is the ratio of the ion concentrations of the halo implant 706 to ion concentrations in the source/drain regions 704. The capacitance of the pn junction between the source/drain region 704 and halo implant 706 is a function of the relative ion concentrations of those areas. In order to provide for good channel boosting, this capacitance should be low. Thus, in some embodiments, the doping concentrations are selected to achieve a lower pn junction capacitance in the MLC region 200a than in the SLC region 200b. In some embodiments, a lower source/drain ion concentration leads to a lower capacitance. In some embodiments, a higher halo implant ion concentration leads to a lower capacitance. For example, more halo implant is used in the MLC region 200a than in the SLC region 200b. Alternatively, less source/drain implant may be used in the MLC region 200a than in the SLC region 200b. Of course, both options can be used together.

Figure 8:
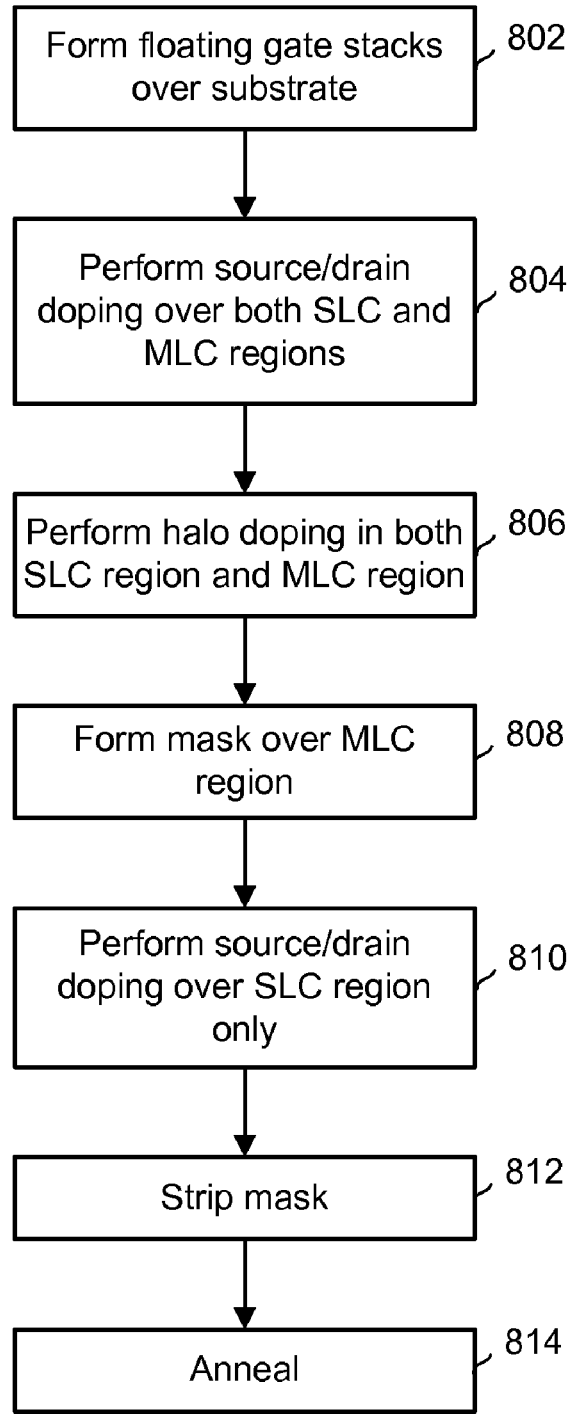
FIG. 8 depicts a flowchart illustrating one embodiment of a process of forming a memory array having an SLC region and an MLC region.

FIG. 8 depicts a flowchart illustrating a process 800 of forming a memory array 200 having an SLC region 200b and an MLC region 200a. Process 800 results in greater ion concentration for the source/drain regions 704 in the SLC region 200b than in the MLC region 200a. FIG. 9A-9D depict various stages of formation of the memory array. Note that FIGS. 9A-9D shows the border between the SLC region 200b and MLC region 200a to highlight the different processing of the two regions 200a, 200b.

Figure 9A:
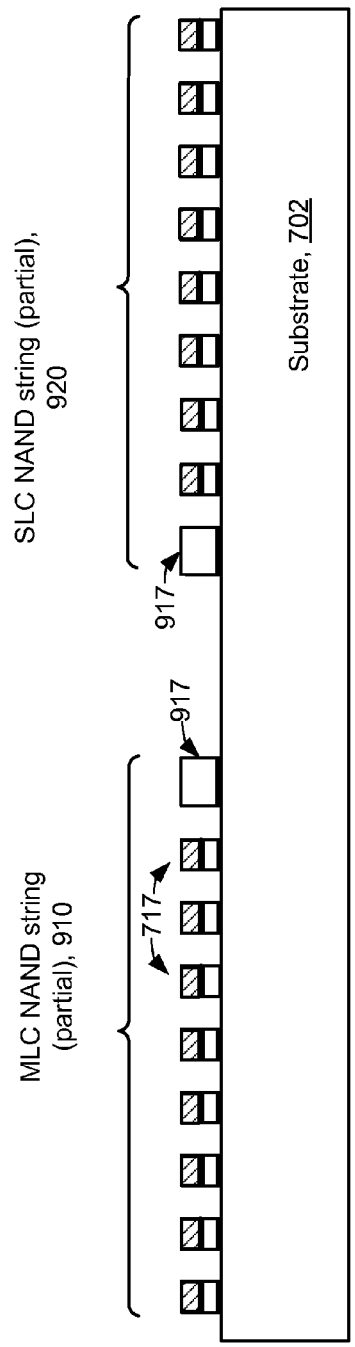

In step 802, floating gate stacks 717 are formed over a substrate 702 in both the MLC region 200a and the SLC region 200b. Note that the tunnel oxide layer 712 may also be formed in step 802. FIG. 9A depicts results after step 802. Specifically, a portion of an MLC NAND string 910 and a portion of an SLC NAND string 920 are depicted. A full NAND string includes 64 floating gate stacks in one embodiment. However, a NAND string may have more or fewer floating gate stacks. Each NAND string 910, 920 also has one control gate 917 for a select transistor depicted at each end of the NAND string. The end of the NAND string that is not depicted may have another select transistor. Thus, each NAND string may have one select gate at each end. For example, referring to FIG. 1, the NAND string 126 has control gates 120CG and 122CG at either end.

Figure 9B:
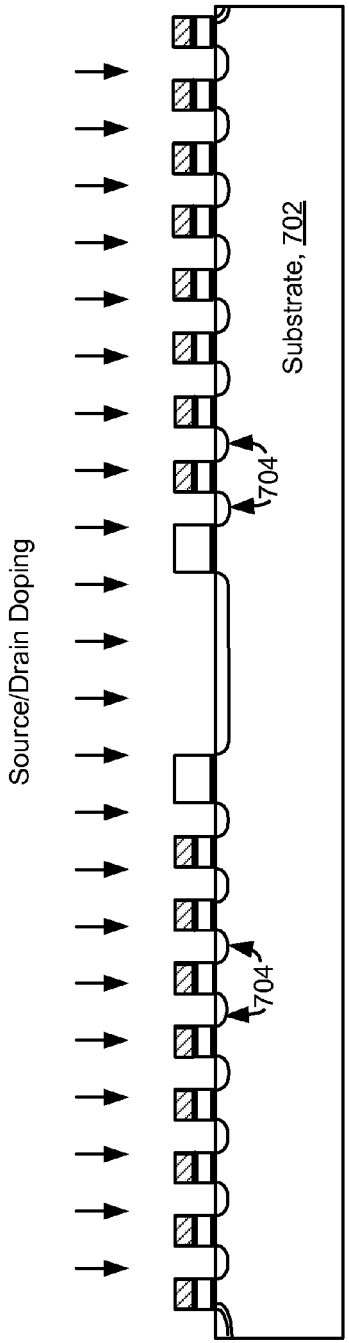

In step 804, implantation of impurity ions is performed in both the SLC region 200b and the MLC region 200a. In step 804, the ion concentration is targeted at a desired source/drain ion concentration for the MLC region 200a. The source/drain ion concentration in the SLC region 200b will be increased in a later step. Hence, step 804 does not produce the final ion concentration for the source/drains in the SLC region 200b. Specifically, the impurity ion concentrations that are established in the source/drain regions 704 of the MLC region 200a (along with later halo doping) is selected to provide for high reliability in the MLC region 200a. In one embodiment, n-type impurity ions such as arsenic are used for the source/drains in both the MLC region 200a and SLC region 200b. An example concentration is $1.5 \times 10^{13}$ ions/cm$^2$. The ion implant energy may be 15-20 KeV, as an example range. Another impurity ion such as phosphorus may be used instead of arsenic, or in addition to arsenic. In one embodiment, a p-type impurity ion is implanted for the source/drains 704. FIG. 9B depicts impurity ions being implanted for source/drain regions 704 in both the MLC region 200a and SLC region 200b.

In step 806, halo doping is performed in both the SLC region 200b and MLC region 200a. The halo dopant is performed with ions having the opposite conductivity than those used to form the source/drains 704. In one embodiment, the halo dopant is boron. An example concentration is $1.5 \times 10^{13}$ ions/cm$^2$. The ion implant energy may be about 10 KeV or less. FIG. 9C depicts impurity ions being implanted for halo regions 716 in both the MLC region 200a and SLC region 200b. In some embodiments, at least a portion of the halo dopant is implanted adjacent to the source/drains regions just below the active channel. Note that a relatively high tilt angle may be used to implant the halo dopant such that at least some of the halo dopant is under the floating gate. The halo implants may serve to prevent or reduce short channel effects by preventing expansion of the source/drain depletion region into the channel when the device is biased for operation. Note that while the halo doping may be depicted as being deeper than the source/drain region, this is not a requirement. For example, the depth of the halo implant is not necessarily deeper than the source/drains.

In step 808, a mask (FIG. 9D, 955) is formed over the MLC region 200a, but not over the SLC region 200b. In one embodiment, the mask 955 is formed from photoresist as follows. First, a layer of photoresist is deposited over the floating gate stacks 717 and tunnel oxide layer 712 in both the MLC region 200a and SLC region 200b. The photoresist is patterned by an exposure and development process. Specifically, a pattern is formed on the photoresist by exposing the photoresist to light through a mask (or reticle) using a photo lithography tool. Then, a portion of the photoresist is removed leaving the pattern.

In step 810, additional impurity ions are implanted in only the SLC region 200b to finalize the ion concentration for the source/drain regions 704. The conductivity of the impurity ions are the same as used in step 804 that provided the initial ion concentration for source/drain regions 704 in SLC region 200b. In one embodiment, n-type impurity ions such as arsenic are used. An example range of ion concentrations for step 810 is $2.0 \times 10^{12}$ to $3.0 \times 10^{12}$ ions/cm$^2$. The ion implant energy may be 15-20 KeV, as an example range. FIG. 9D depicts impurity ions being implanted for source/drain 704 in only the SLC region 200b with a mask 955 over the MLC region 200a.

It is not required that any additional halo doping be performed in the SLC region 200b in step 810. However, if performed the halo doping should be performed at a lower concentration than the halo doping of step 806. As an example, boron is implanted with an ion concentration of $1.0 \times 10^{12}$ and an implant energy of 10 KeV or less.

Note that the doping for the source/drain regions 704 of both the SLC region 200b and MLC region 200a and the halo doping of both regions can be achieved while only using a single mask 955. In step 812, the photoresist mask 955 is stripped.

In step 814, a post implant anneal is performed that anneals the source/drain regions 704. The anneal process may be a rapid thermal anneal (RTA). Example parameters for RTA are heating to 1000 Celsius for ten seconds. Note that the anneal might be performed at another stage, such as prior to removing the photoresist.

Figure 10:
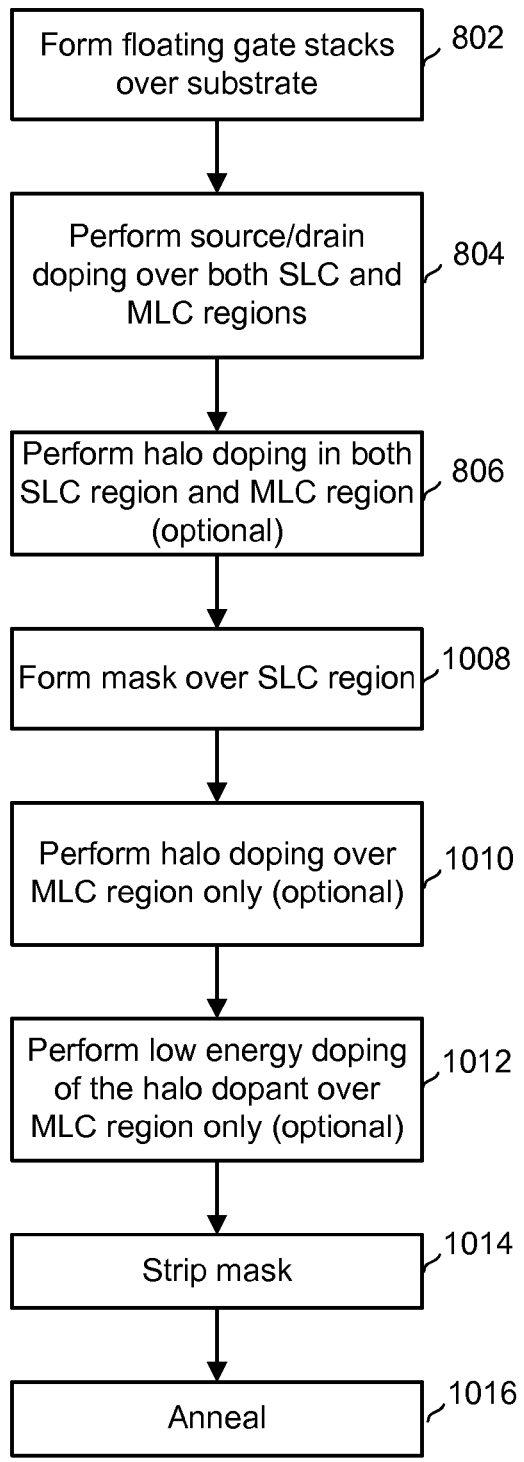
FIG. 10 depicts a flowchart illustrating one embodiment of a process of forming a memory array having an SLC region and an MLC region.

As previously discussed increasing the source/drain ion concentration in the SLC region 200b is not the only way to dope the regions 200a, 200b differently to achieve desired properties in each region. FIG. 10 depicts a flowchart illustrating a process 1000 of forming a memory array 200 having an SLC region 200b and an MLC region 200a. Process 1000 involves using similar ion concentrations for the source/drain regions 704 in both the SLC region 200b and MLC region 200a. However, the SLC region 200b has a lower concentration of ions that have the opposite conductivity of those used for source/drain regions 704. As an example, less halo doping is performed in the SLC region 200b. FIGS. 9A-9C and 11 depict various stages of formation of the memory array according to process 1000. In step 802, floating gate stacks 717 are formed over a substrate 702 in both the MLC region 200a and the SLC region 200b. FIG. 9A depicts results after step 802.

In step 804, implantation of impurity ions is performed in both the SLC region 200b and the MLC region 200a. In one embodiment, n-type impurity ions such as arsenic are used for the source/drains in both the MLC region 200a and SLC region 200b. An example concentration is $1.5 \times 10^{13}$ ions/cm$^2$. The ion implant energy may be 15-20 KeV, as an example range. Another impurity ion such as phosphorus may be used. In one embodiment, a p-type impurity ion is implanted for the source/drains 704. FIG. 9B depicts impurity ions being implanted for source/drain regions 704 in both the MLC region 200a and SLC region 200b.

In optional step 806, halo doping is performed in both the SLC region 200b and MLC region 200a. In one embodiment, there is no halo implant in the SLC region 200b, in which case step 806 is not performed. If used, the halo dopant is performed with ions having the opposite conductivity than those used to form the source/drains 704. In one embodiment, the halo dopant is boron. An example concentration is $1.0 \times 10^{13}$ ions/cm$^2$. The ion implant energy may be about 10 KeV or less. FIG. 9C depicts impurity ions being implanted for halo regions 716 in both the MLC region 200a and SLC region 200b.

In step 1008, a mask (FIG. 11, 1155) is formed over the SLC region 200b, but not over the MLC region 200a. In one embodiment, the mask 1155 is formed from photoresist as follows. First, a layer of photoresist is deposited over the floating gate stacks 717 and tunnel oxide layer 712 in both the MLC region 200a and SLC region 200b. The photoresist is patterned by an exposure and development process such that the SLC region 200b is covered by the photoresist mask 1155, but the MLC region 200a is exposed.

Figure 11:
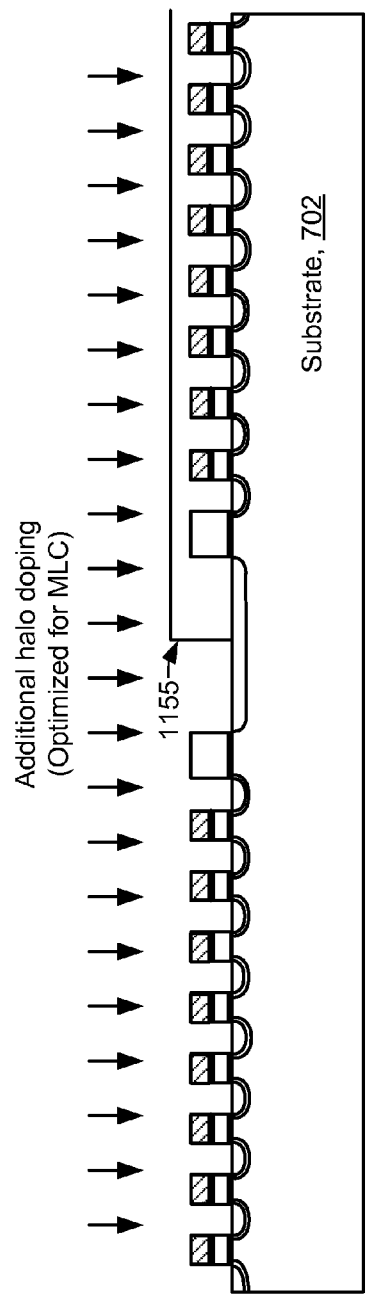
FIG. 11 depicts a stage of formation of the memory array according to the process depicted in FIG. 10.

In optional step 1010, impurity ions are implanted in only the MLC region 200a as a halo implant. The halo dopant is performed with ions having the opposite conductivity than those used to form the source/drains 704. The conductivity of the impurity ions are the same as used in step 806 if halo implanting was performed in that step. In one embodiment, the halo dopant is boron. The ion concentration may depend on whether there was a first halo ion implant in step 806. An example concentration when there was a first implant at a concentration of $1.0 \times 10^{13}$ in step 806 is $5.0 \times 10^{12}$ ions/cm$^2$ in step 1010. The ion implant energy may be about 10 KeV or less. An example ion concentration for step 1010 when there was no implant in step 806 is $1.5 \times 10^{13}$ ions/cm$^2$. The ion implant energy may be about 10 KeV or less. FIG. 11 depicts impurity ions being implanted for halo regions 716 in only the MLC region 200a. Thus, the net result of the combination of steps 806 and 1010 is that the concentration of ions for the halo implant is greater in the MLC region 200a than in the SLC region 200b.

In optional step 1012, ions having the opposite conductivity of the source/drain region are implanted at a relatively shallow depth in the MLC region 200a. For example, the same ions used for the halo implant are implanted at a lower energy than when used as a halo implant. In one embodiment, the additional low energy halo dopant is boron. An example concentration is $2.0 \times 10^{12}$ ions/cm$^2$. The ion implant energy may be about 3-5 KeV or less. A reason for this additional halo dopant may be to counteract some of the source/drain dopant that was performed in step 804. Note that step 1012 can be used with or without step 1010. Likewise, step 1010 can be used with or without step 1012.

In step 1014, the photoresist mask 955 is stripped from the SLC region 200b. In step 1016, a post implant anneal is performed that anneals the source/drain regions 704. The anneal process may be a rapid thermal anneal (RTA). Example parameters for RTA are heating to 1000 Celsius for ten seconds. Note that the anneal might be performed at another stage, such as prior to removing the photoresist.

Figure 12:
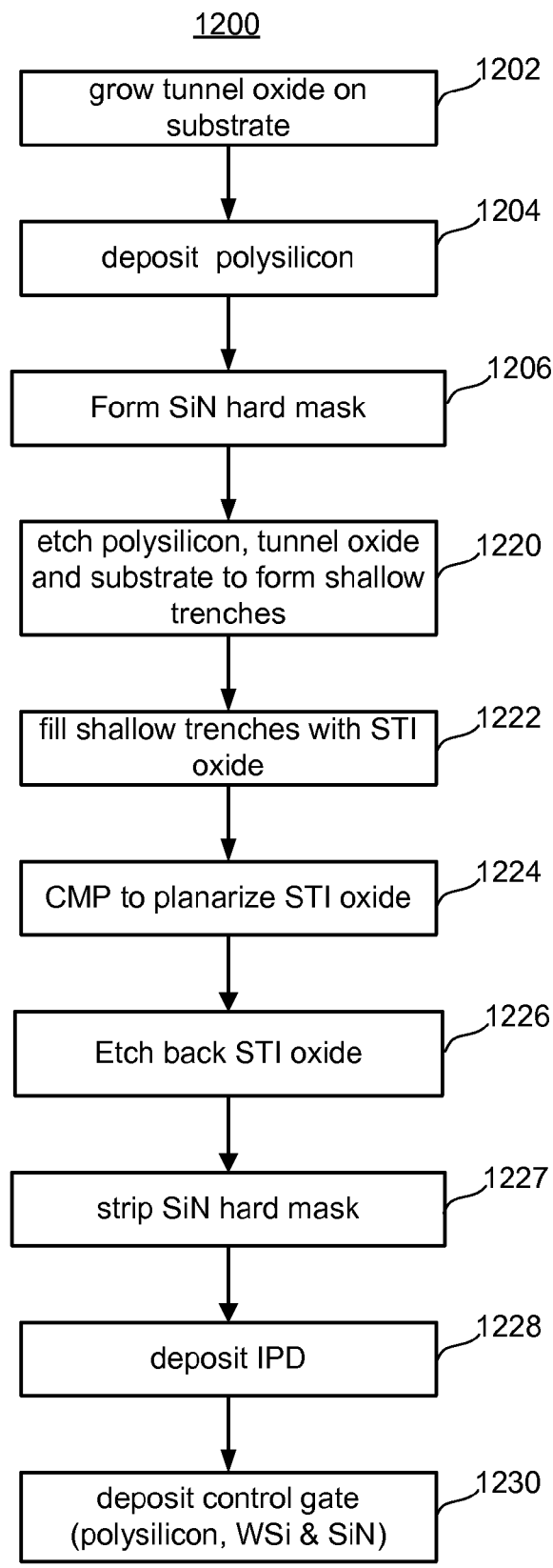
FIG. 12 is a flow chart describing one embodiment of a portion of a process for forming floating gate stacks.

FIG. 12 is a flow chart describing one embodiment of a portion of a process 1200 for forming floating gate stacks. Process 1200 is one implementation of step 802 of processes 800 and 1000. Note that steps of process 1200 may be used to form both MLC region 200a and the SLC region 200b. This flow chart does not describe all implant steps, the gap fill of etched volumes between the floating gate stacks, or forming the contacts, metallizations, vias, and passivation, as well as other portions of the manufacturing process known in the art. There are many ways to manufacture memory according to the present invention and, thus, the inventors contemplate that various methods other than that described by FIG. 12 can be used. While a flash memory chip will include core memory and peripheral circuitry, the process steps of FIG. 12 are intended only to describe in general terms one possible process recipe for the fabrication of the floating gate stacks in the MLC region 200a and SLC region 200b. For example, the floating gates can be formed to have many different shapes. In some embodiments, the floating gates have a relatively wide base with a relatively narrow stem above the base.

Step 1202 of FIG. 12 includes growing oxide material on top of a silicon substrate 702. This oxide will be used top form the tunnel oxide 712. In step 1204, a polysilicon layer that will be used to form the floating gates 706 is deposited over the oxide material using CVD, PVD, ALD or another suitable method. In step 1206, a SiN hard mask is formed over the polysilicon layer to allow etching to form STI structures. Forming the SiN mask may be performed as follows. First, SiN is deposited over the entire polysilicon layer using, for example, CVD. Next, a photoresist layer is added over the SiN. The photoresist is exposed and developed to form a mask pattern. The pattern is transferred to the SiN, thus forming the SiN hard mask.

Next, shallow trench isolation trenches are formed based on the SiN hard mask. In step 1220, the polysilicon layer, the oxide material, and the top of the silicon substrate 702 are etched. In one embodiment, the etch is approximately 0.2 microns into the substrate 702 to create shallow trench isolation (STI) areas, where the bottom of the trenches are inside the top of the P-well. Forming the shallow trench isolation trenches also etches the polysilicon into strips that run in the direction of what will become NAND strings. Thus, the STI structures will separate adjacent NAND strings.

In step 1222, the STI trenches are filled with isolation material such as partially stabilized zirconia (PSZ), SiO$_2$ (or another suitable material) up to the top of the SiN hard mask using CVD, rapid ALD or another method. In step 1224, chemical mechanical polishing (CMP), or another suitable process, is used to polish the isolation material flat until reaching the SiN hard mask.

Step 1226 is etching back the STI isolation material. Step 1227 is removing the SiN hard mask. In step 1227, the SiN hard mask is stripped. In step 1228, the inter-poly dielectric 708 is grown or deposited. The IPD 708 may include alternating conformal layers of oxide and nitride. For example, an Oxide Nitride Oxide (ONO) inter-poly dielectric is used. In one embodiment, the IPD 708 comprises nitride-oxide-nitride-oxide-nitride.

In step 1230, the control gates 252 (word lines) are deposited. Step 1230 may include depositing a poly-silicon layer, a Tungsten Silicide (WSi) layer and a Silicon Nitride (SiN) layer. When forming the control gates 252, photolithography is used to create patterns of strips perpendicular to NAND strings (e.g., perpendicular to the polysilicon strips from which the floating gates 702 are formed), in order form word lines that are isolated from one another. In step 1230, etching is performed using plasma etching, ion milling, ion etching that is purely physical etching, or another suitable process to etch the various layers and form the individual word lines. The result of process 1200 is depicted in FIG. 9A.

There are many alternatives to the above described structures and processes within the spirit of the present invention. As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc.

In process 1200 the STI structures are formed in a similar manner in both the MLC region 200a and SLC region 200b. Techniques are disclosed herein for forming shallow trench isolation (STI) structures differently for SLC blocks than for MLC blocks, in order to improve the endurance of the SLC blocks while providing for high reliability in the MLC blocks. In one embodiment, a deep etch back is performed in the MLC region 200a and a shallow etch back is performed in the SLC region 200b.

Figure 13:
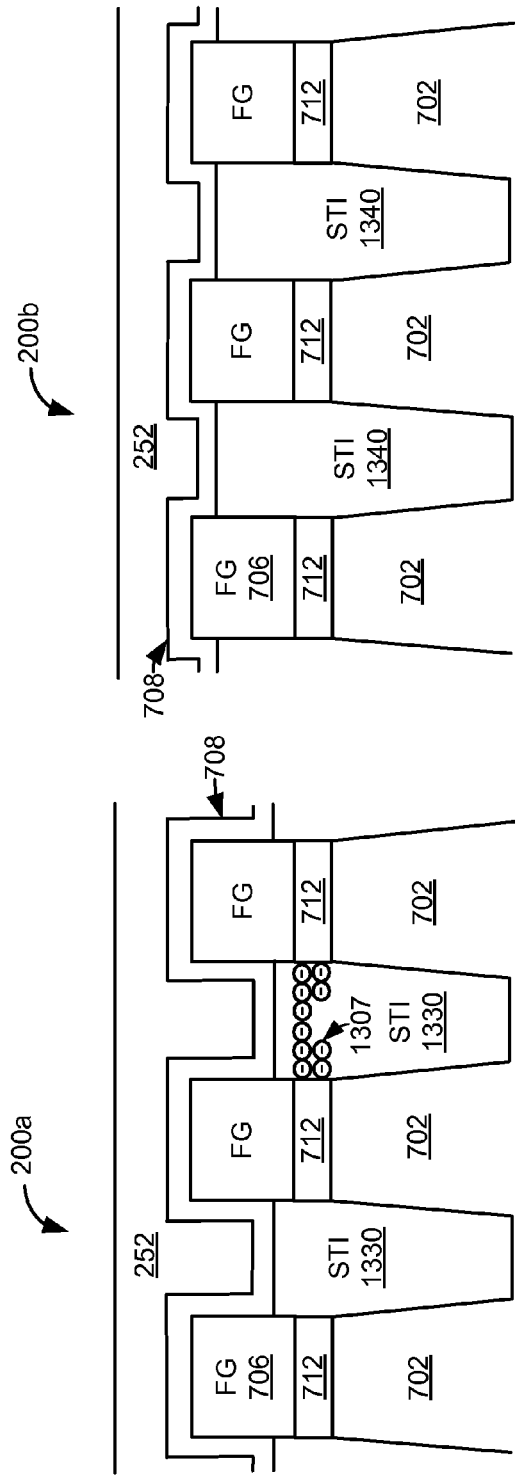
FIG. 13 depicts a portion of a memory array having an MLC region and an SLC region.

FIG. 13 depicts a portion of a memory array 200 having an MLC region 200a and an SLC region 200b. The portion containing MLC region 200a is a perspective along line A-A' of FIG. 2B. Likewise, the portion containing MLC region 200a is a perspective along line A-A' of FIG. 2B, bearing in mind that the SLC region 200b and MLC region 200a are in separate parts of the memory array 200. Each region 200a, 200b has floating gates 706 over a substrate 702. Each of the depicted floating gates 706 is one floating gate 706 in a NAND string (not depicted in FIG. 13). A tunnel oxide layer 712 resides between the floating gate 706 and substrate 702. An inter-poly dielectric layer 708 covers the floating gates 706, as well as the tops of the STI structures 1330, 1340. A control gate (or word line) 252 resides over the IPD 708.

Shallow trench isolation (STI) structures 1330, 1340 serve to provide electrical isolation between NAND strings. For example, the STI structures 1330, 1340 provide electrical isolation between source/drain regions and channels (not depicted in FIG. 13). The shallow trench isolation structures (STI) 1330 in the MLC region 200a have a deep etch back, whereas the shallow trench isolation structures 1340 in the SLC region 200b have a shallow etch back. That is, the top of STI structures 1330 has been etched back to a level that is near the bottom of the floating gates 706, whereas the top of STI structures 1340 in the SLC region 200b is near the top of the floating gates 706.

The height of the STI structures 1330, 1340 affects how far the control gate 252 extends between floating gates on adjacent NAND strings. For example, the control gate 252 the control gate 252 extends significantly into the region between the floating gates 706 in the MLC region 200a, but does not for the SLC region 200b.

The deep STI etch back in the MLC region 200a provides for a good capacitive coupling ratio between the floating gates 706 and the word line 252, as the word line 252 tends to "wrap around" the floating gates 706 to some extent. A good coupling ratio may be desirable in the MLC region 200a because it facilitates programming. That is, for a given voltage applied to the word line 252, electrons can more easily be injected from the channel to the floating gate 706 if the coupling ratio is higher.

However, the deep etch back results in the word lines 252 being closer to the memory cell channels in the MLC region 200a relative to the shallow etch back in the SLC region 200b. This means that some charge 1307 may become trapped in the STI structures 1330 when a program voltage is applied to the word lines 252. The trapped charge 1307 tends to increase with greater erase/program cycles in a similar manner to the trapped charge 707 discussed with respect to FIG. 7. However, recall that the SLC region 200b may be subjected to more erase/program cycles than the MLC region 200a. Therefore, having the shallow etch back in the SLC region 200b to prevent, or at least reduce, trapped charge in the SLC region 200a can be beneficial for the SLC region 200b. However, having the deep etch back in the MLC region 200a provides for a good coupling ratio while not necessarily harming endurance significantly due to the fewer erase/program cycles in the MLC region 200a.

Figure 14:
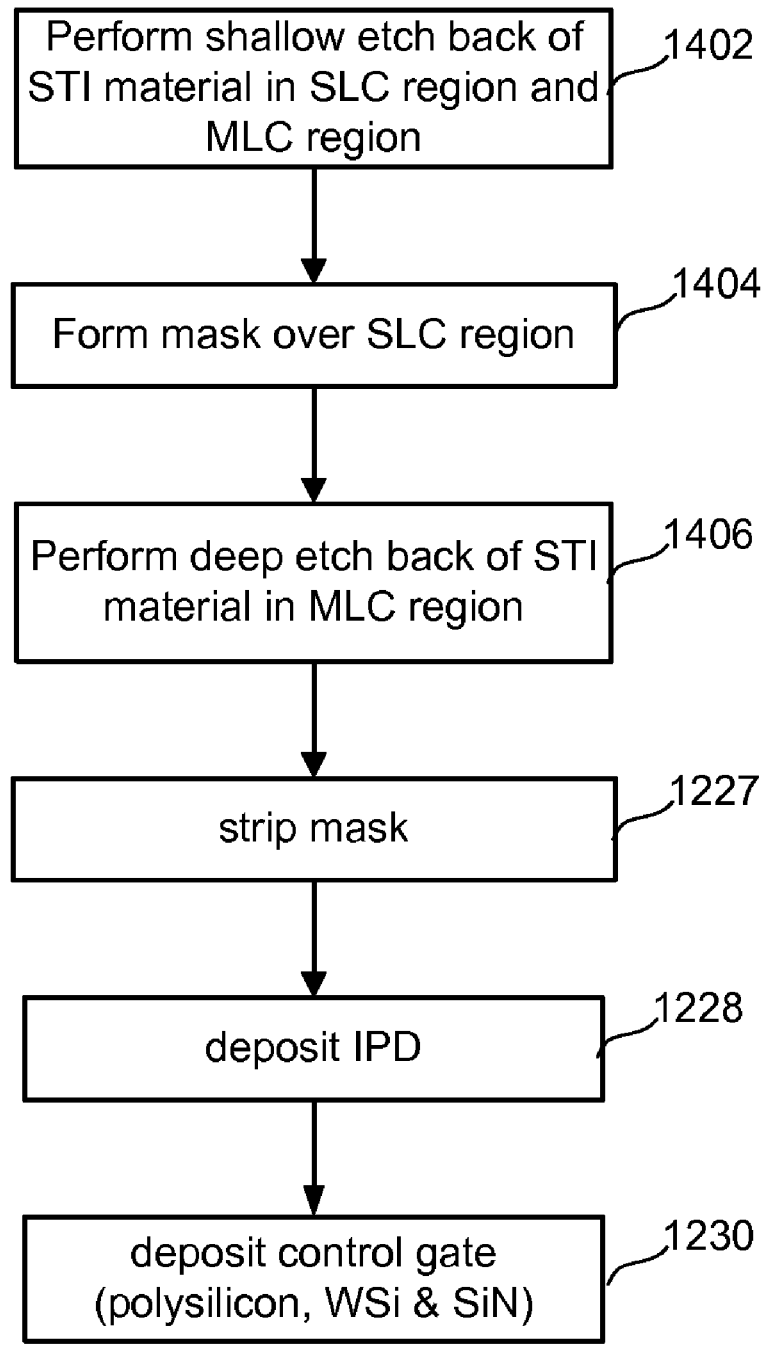
FIG. 14 depicts one embodiment of a process of forming a memory array having an MLC region and an SLC region.
Figure 15A:
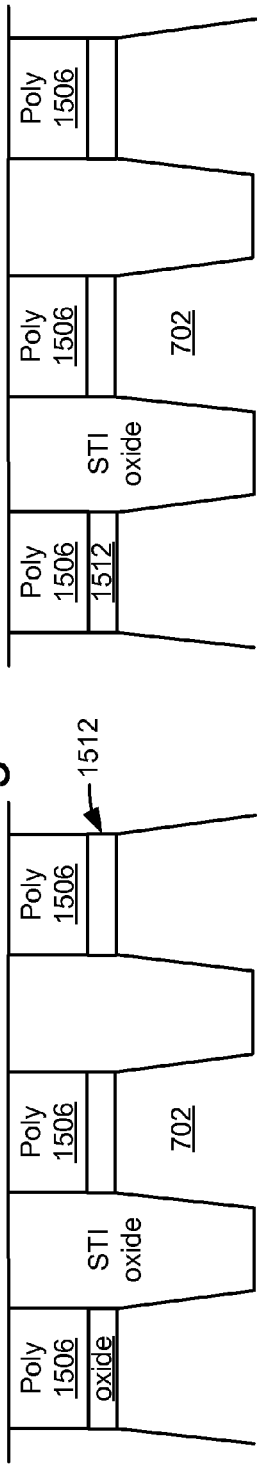
FIGS. 15A-15C depicts a portion of a memory array during formation using the process of FIG. 14.

One embodiment is a process for forming a memory array having an MLC region 200a with a deep STI etch back and an SLC region 200b with a shallow STI etch back. FIG. 14 depicts one embodiment of such a process 1400. FIG. 15A depicts a portion of a memory array that has been partially formed prior to performing process 1400. Steps 1202-1224 may be performed to form a structure such as depicted in FIG. 15A. FIG. 15A depicts polysilicon strips 1506 that will be used to form floating gates 706, oxide 1512 that will be used to form tunnel oxide 712, substrate 702, and the initial formation of STI structures. Recalling process 1200, trenches are formed (step 1220) and then filled with an insulator (step 1222). Next, CMP or another technique is used to planarize (step 1224) to arrive at the structure of FIG. 15A. At this point, the polysilicon 1506 is long strips that will be used to form the floating gates 706. In one embodiment, the width of the polysilicon for the floating gates 1506 is about 43 nm and the separation between each polysilicon strip 1506 is about 43 nm. The height of the polysilicon strip 1506 is about 70 nm, in one embodiment.

Figure 15B:
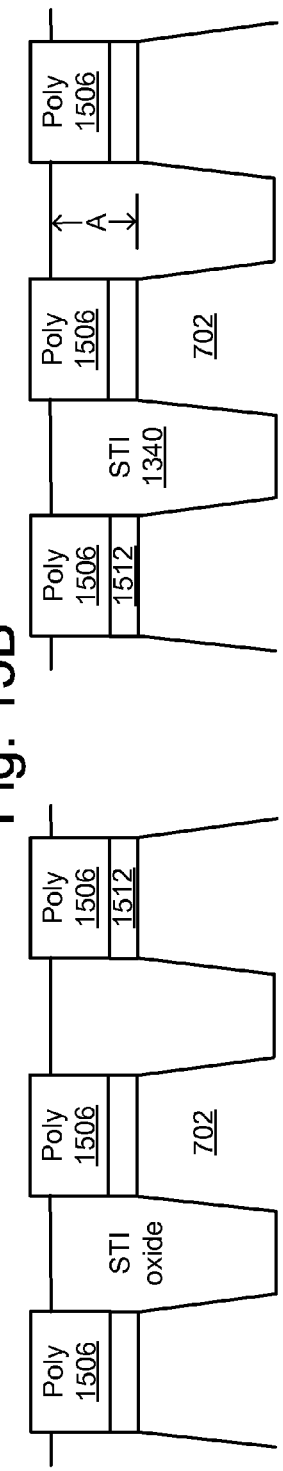

In step 1402 of process 1400, a shallow etch back of the STI material in the SLC region 200b and MLC region 200a is performed. While it is not required to perform a shallow etch back of the MLC region 200a at this time, etching back both regions avoids the need to form a mask over the MLC region 200a. FIG. 15B depicts results after performing step 1402. In one embodiment, the shallow etch back depth results in a distance "A" from the top of the STI structure 1340 to the top of the active region of about 30-35 nm. In one embodiment, the coupling ratio (after forming control gates) is about 0.55 to 0.60 in the SLC region 200b.

In step 1404, a mask (FIG. 15C, 1555) is formed over the SLC region 200b. In one embodiment, the mask 1555 is formed by depositing photoresist and exposing the photoresist to light through a mask (or reticle) using a photo lithography tool. Then, the portion of the photoresist that is over the MLC region 200*a* is removed leaving the SCL region 200*b* covered.

Figure 15C:
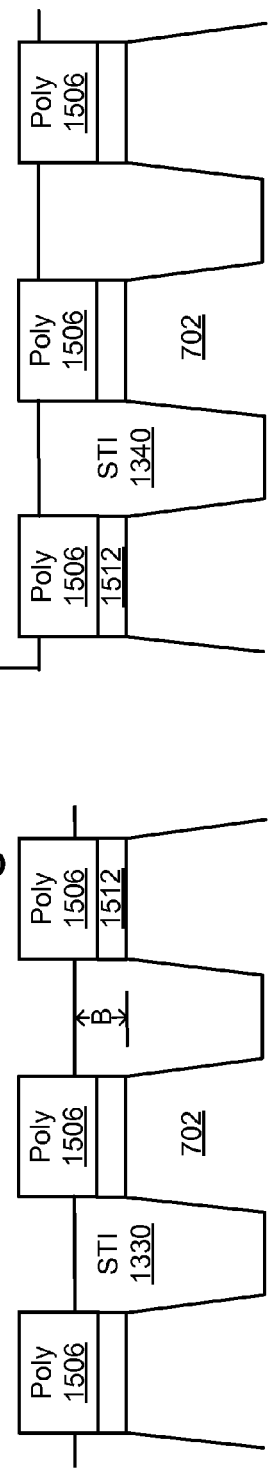

In step 1406, a deep etch back of the STI material in the MLC region 200*a*. FIG. 15C depicts results after performing step 1406. In one embodiment, the deep etch back results in a distance "B" between the top of the STI structure 1330 and the top of the active region of about 25-30 nm. The deep etch back provides for a desired coupling ratio between the floating gates and control gates. In one embodiment, the coupling ratio is about 0.60 to 0.65 in the MLC region 200*a*.

Next, the mask 1555 is stripped from the SLC region 200*b* (step 1227), IPD is deposited (step 1228), and the control gate is formed (1230). Steps 1227-1230 have been discussed in connection with process 1200. FIG. 13 depicts results after performing step 1230. Source/drain regions 704 may then be formed. In one embodiment, process 800 of FIG. 8 is used to form the source/drain regions 704. In one embodiment, process 1000 of FIG. 10 is used to form the source/drain regions 704. However, note that it is not required to dope the SLC region 200*b* differently than the MLC region 200*a* in combination with process 1400.

Note that when forming some of the memory arrays as described herein, that a mask might be misaligned. For example, mask 955 in FIG. 9D might be misaligned such that instead of ending between the MLC NAND string 910 and the SLC NAND string 920, the mask 955 ends somewhere over either the MLC NAND string 910 or the SLC NAND string 920. Note that to the left of MLC NAND string 910 there will be many other MLC NAND strings 910 and that to the right of SLC NAND string 920 there will be many other SLC NAND strings 920. Thus, FIGS. 9A-9D are depicting NAND strings at the border between the MLC region 200*a* and the SLC region 200*b*. In one embodiment, the controller 244 does not use the NAND strings 910, 920 along the border in order to avoid a problem due to mask 955 misalignment. In one embodiment, the mask 955 is intentionally misaligned such that its edge will fall over the MLC NAND string 910. That MLC NAND string 910 is thus sacrificed and not used. However, the SLC NAND string 920 is used. In one embodiment, the mask 955 is intentionally misaligned such that its edge will fall over the SLC NAND string 920. That SLC NAND string 920 is thus sacrificed and not used. However, the MLC NAND string 910 is used.

Techniques are disclosed herein for adjusting read parameters as a function of device usage (e.g., cycle count) in order to compensate for increased Icell due to the trapped charge 707. In prior art devices, the same voltage may be applied to bit lines during a read operation for new devices that have not been significantly used (also called fresh devices) and heavily used devices. However, as a non-volatile memory device undergoes many programming cycles, charge becomes trapped in the insulation next to the floating gate. This trapping of charge increases the NAND string resistance, which decreases Icell.

Figure 18:
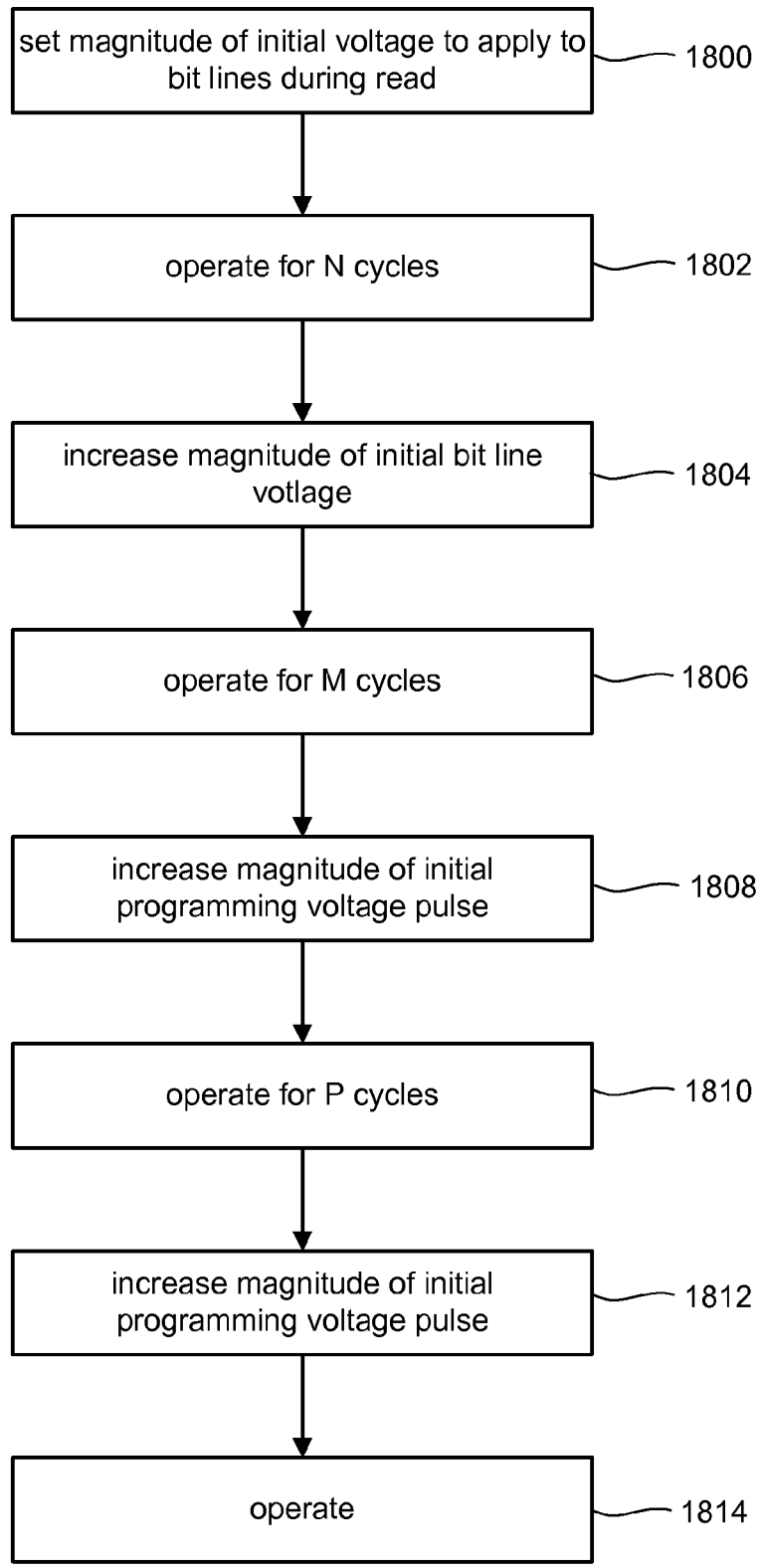
FIG. 18 is a flow chart describing one embodiment of a process for reading non-volatile memory by varying the magnitude of the voltage applied to the bit line during a read as a function of use of the block of storage cells involved in the read.

FIG. 18 is a flow chart describing one embodiment of a process for reading non-volatile memory by varying the magnitude of the voltage applied to the bit line during a read as a function of use of the block of storage cells involved in the read. In one embodiment, the process may be performed for each block of non-volatile storage elements for which a cycle count is maintained. For example, a cycle count may be maintained for each block. In some embodiments, the process is performed for SLC blocks, but not for MLC blocks. However, the process may be used for MLC blocks.

In step 1800, the initial bit line voltage to be used during a read operation for memory cells is set. In step 1802, the block is operated for N cycles, where the number N is predetermined in advance or determined on the fly. For example, N could be a predetermined cycle count, or alternatively, however many cycles it takes for erasing or soft programming the memory cells to reach a certain level of difficulty. Operating the block for the N cycles includes reading memory cells in the block by applying the initial bit line voltage during the read operation. In one embodiment, the number of times the block has been erased and programmed is maintained as the number of cycles. In step 1804, after N cycles, the magnitude of the initial bit line voltage is increased. In one example, the bit line voltage is increased by 0.1 V. In another example, the bit line voltage is increased by an amount that is determined based on the resistance of NAND strings in the block. As previously discussed, the resistance of NAND strings may increase over time as charge becomes trapped in the tunnel oxide 712 on either side of the floating gate 706.

In step 1806, the block is operated for M cycles (M can be the same or different than N), where the magnitude of the number M is determined in advance or on the fly. While operating the block for the M cycles, the new bit line voltage is used when reading memory cells in the block.

In step 1808, after operating for N+M cycles, the bit line voltage for reads is increased to a new value. In one example, the bit line voltage is increased by an additional 0.1 V. In step 1810, the block is operated for an additional P cycles, where the magnitude of P is known in advance or determined on the fly. In step 1812, the magnitude of the bit line voltage for a read operation is increased. In step 1814, the block is operated with the new bit line read voltage. The process of increasing the magnitude of the bit line voltage during read can continue for as many steps as desired.

Figure 19:
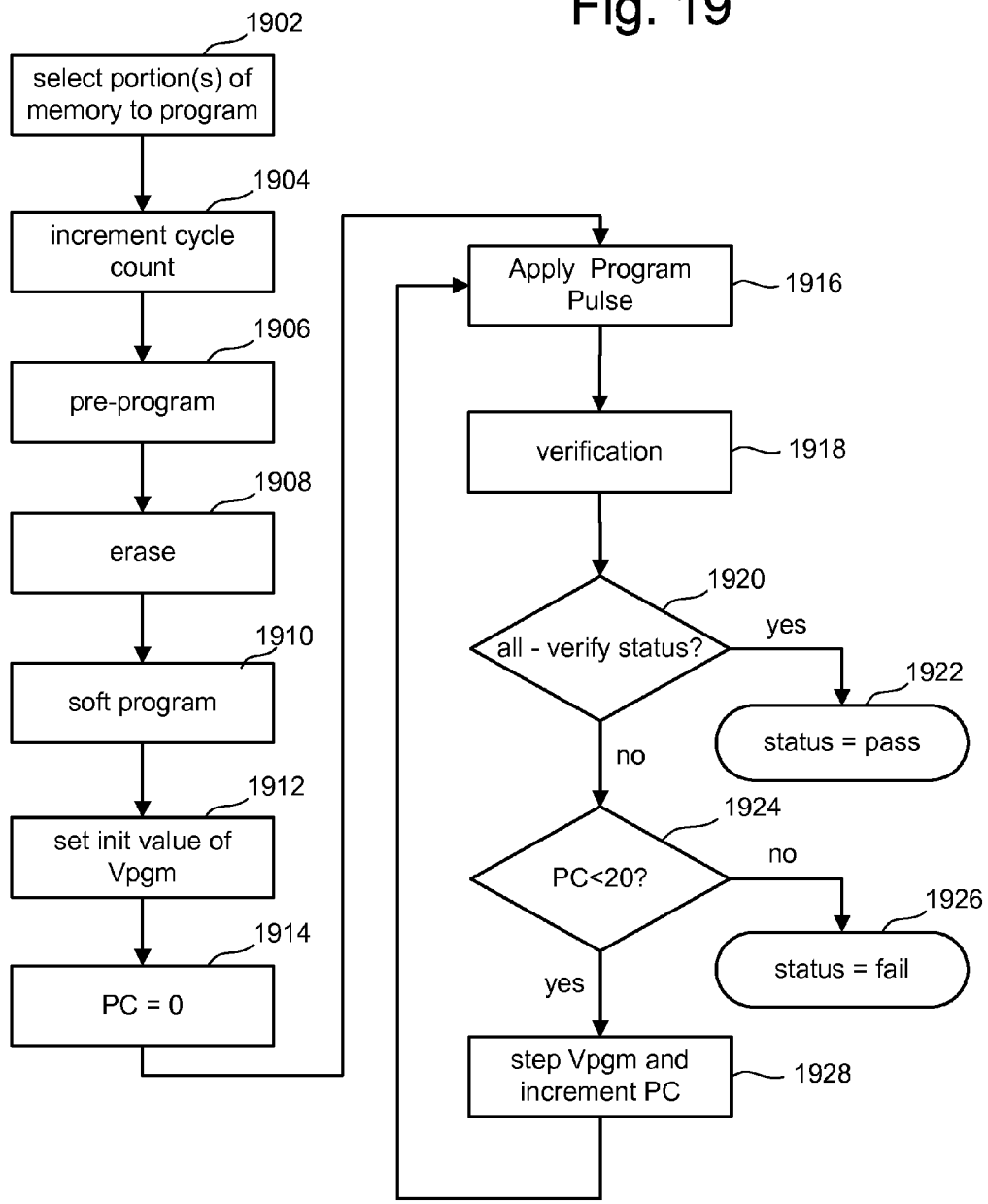
FIG. 19 is a flow chart describing details of programming memory cells, where the system counts the number of program cycles.

FIG. 19 is a flow chart describing details of programming memory cells, where the system counts the number of program cycles. The process of FIG. 19 can be performed in response to receiving a request to program data. In step 1902, the system will select the appropriate portions of memory to program. This may include selecting a block and/or page and/or sector to write to. At step 1904, the cycle count is incremented. The cycle count is a count of the number of programming cycles. The cycle count can be stored in the flash memory array, the state machine, the controller, or another location. In one embodiment, the cycle count is stored in a register associated with the state machine. At step 1906, the selected portion of memory is pre-programmed, which provides for even wearing of the flash memory. All memory cells in the chosen sector or page are programmed to the same threshold voltage range. Step 1906 is an optional step. At step 1908, all the memory cells to be programmed are then erased. An example erase distribution for a SLC block is distribution 0 in FIG. 6A. An example erase distribution for a MLC block is distribution 0 in FIG. 6B or 6C. At step 1910, the system performs a soft programming process. During the erase process, it is possible that some of the memory cells have their threshold voltages lowered to a value that is below the erase distribution. The soft programming process will apply program voltage pulses to memory cells so that their threshold voltages will increase to be within the erase distribution. In step 1912, the system will set the magnitude of the initial program pulse. At step 1914, the program count PC will be set to initially be zero. In step 1916, a program pulse is applied to the appropriate word line(s). In step 1918, the memory cells on that word line(s) are verified to see if they have reached the target threshold voltage level. If all the memory cells have reached the target threshold voltage level (step 1920), then the programming process has completed successfully (status=pass) in step 1922. If not all the memory cells have been verified, then it is determined in step 1924 whether the program count PC is less than 20. If the program count is not less than 20, then the programming process has failed (step 1926). If the program count is less than 20, than in step 1928, the magnitude of program voltage signal Vpgm is incremented by the step size (e.g. 0.3 v) for the next pulse and the program count PC is incremented. Note that those memory cells that have reached their target threshold voltage are locked out of programming for the remainder of the current programming cycle. After step 1928, the process of FIG. 19 continues at step 1916 and the next program pulse is applied.

Figure 20:
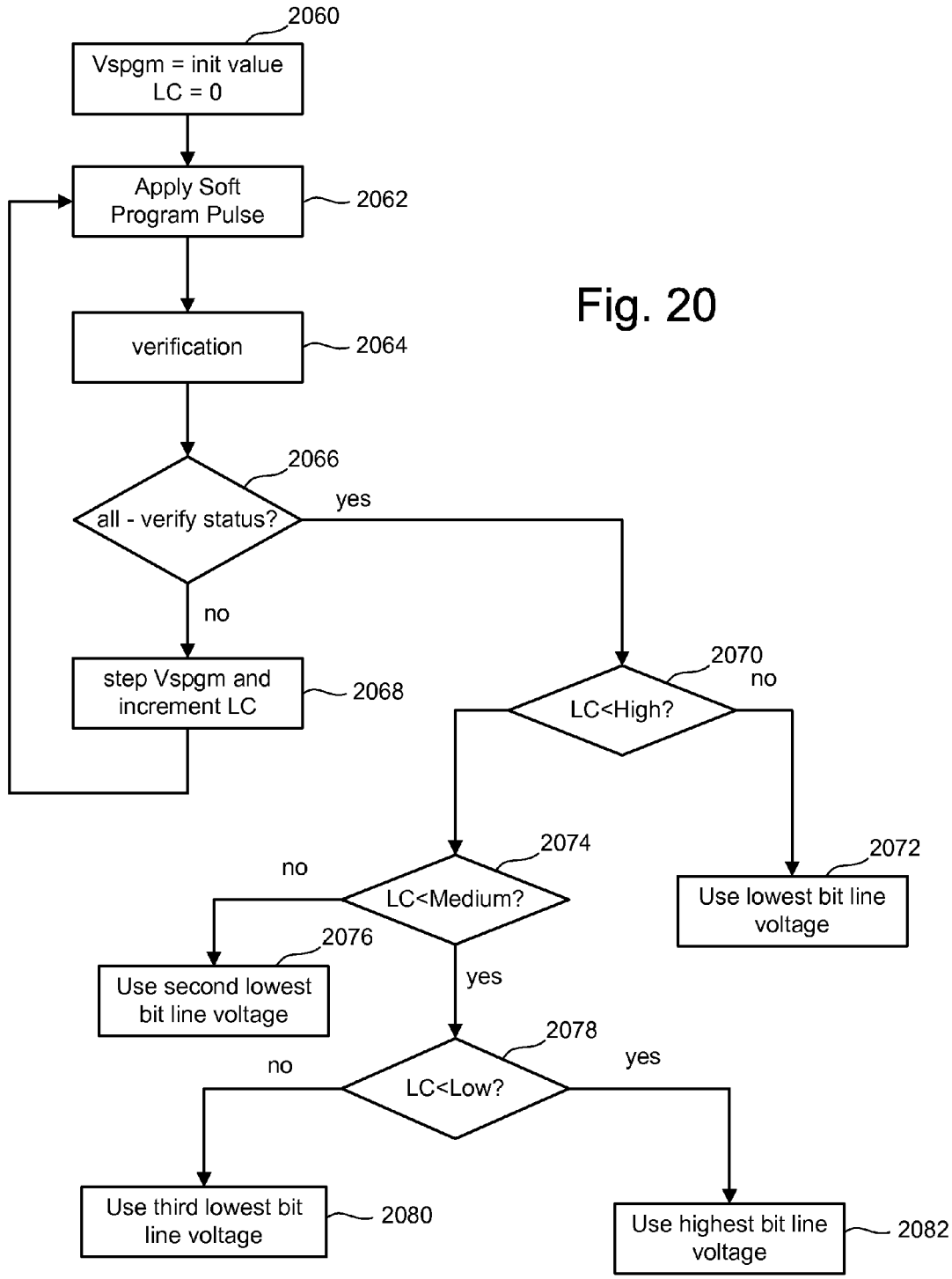
FIG. 20 is a flow chart describing the process of determining an appropriate voltage to apply to bit lines during reads, based on soft programming.

FIG. 20 is a flow chart describing the process of determining an appropriate voltage to apply to bit lines during reads, based on soft programming. Soft programming occurs during step 1910 of the write process of FIG. 19. The process of FIG. 20 uses a set of soft program pulses with increasing magnitude. Because this is used during a soft programming process, the signal is referred to as Vspgm and the pulses are referred to as soft programming pulses. In step 2060 of FIG. 20, the initial pulse has its magnitude set. In one embodiment, the magnitude of the initial pulse during soft programming is approximately 14 volts. Other values can also be used. Additionally, the loop count LC is set at zero. In step 2062, a soft program pulse is applied to the word line(s) of the selected memory cells. In step 2064, a verification process is performed to see whether the memory cells have their threshold voltage within the erase distribution 0 (see FIGS. 6A-6C). If not all the memory cells verified having their threshold voltage in the erase distribution 0, then the soft program voltage signal Vspgm is incremented to the next pulse and the loop count LC is increased by 1. After step 2068, the process loops back to 2062. The loop of steps 2062, 2064, 2066, and 2068 will continue until all the memory cells have verified or the process stops because the system concluded that an error has occurred. For example, the system may limit the number of iterations to no more than 20. After 20, iterations the system will conclude that the memory cells whose threshold voltage are still below threshold erase distribution 0 are damaged and will remove those from normal operational use.

Once all the memory cells verify (step 2066), the process will continue at step 2070 and the system will compare the loop count with values "high" "medium" and "low," where high is greater then medium, which is greater than low. Any suitable value can be used for high, medium, and low. During the process, the bit line voltages is assigned to one of four values that correspond to the level of use. In general, a lower the loop count implies more use.

In step 2070, the system determines whether the loop count LC is less than "high". If not, then the bit line voltage is set to the lowest value. This corresponds to a fresh device.

If the loop count is less than high, then at step 2074 it is determined whether the loop count is less than "medium." If the loop count is not less than medium (e.g., LC=13 or 14) then the bit line voltage is set to the second lowest value.

If the loop count LC is less then "medium," then it is tested whether the loop count is less than "low" at step 2078. If the loop count is not less than "low", then the bit line voltage is set to the third lowest value. If the loop count is less than low, then the bit line voltage is set to the highest value. While the process of FIG. 20 uses four bit line voltage levels, more or fewer can be used.

In addition to counting the programming cycles, as explained with respect to FIG. 19, or counting the number of soft programming loops as explained with respect to FIG. 20, other techniques can be used to determine whether device usage has crossed a threshold. In another embodiment, the system may determine usage based on the amount of error correction used during a read process. In yet another embodiment, the system may determine usage based on the amount of how difficult it is to erase the memory cells. Any of these schemes for adjusting the voltage applied to a bit line during reads can be applied on the entire device as a whole (e.g., the entire memory array), on a block by block basis, or on another subset of the memory. The process can be performed by the controller, the state machine, a combination of both, or another structure.

Figure 21:
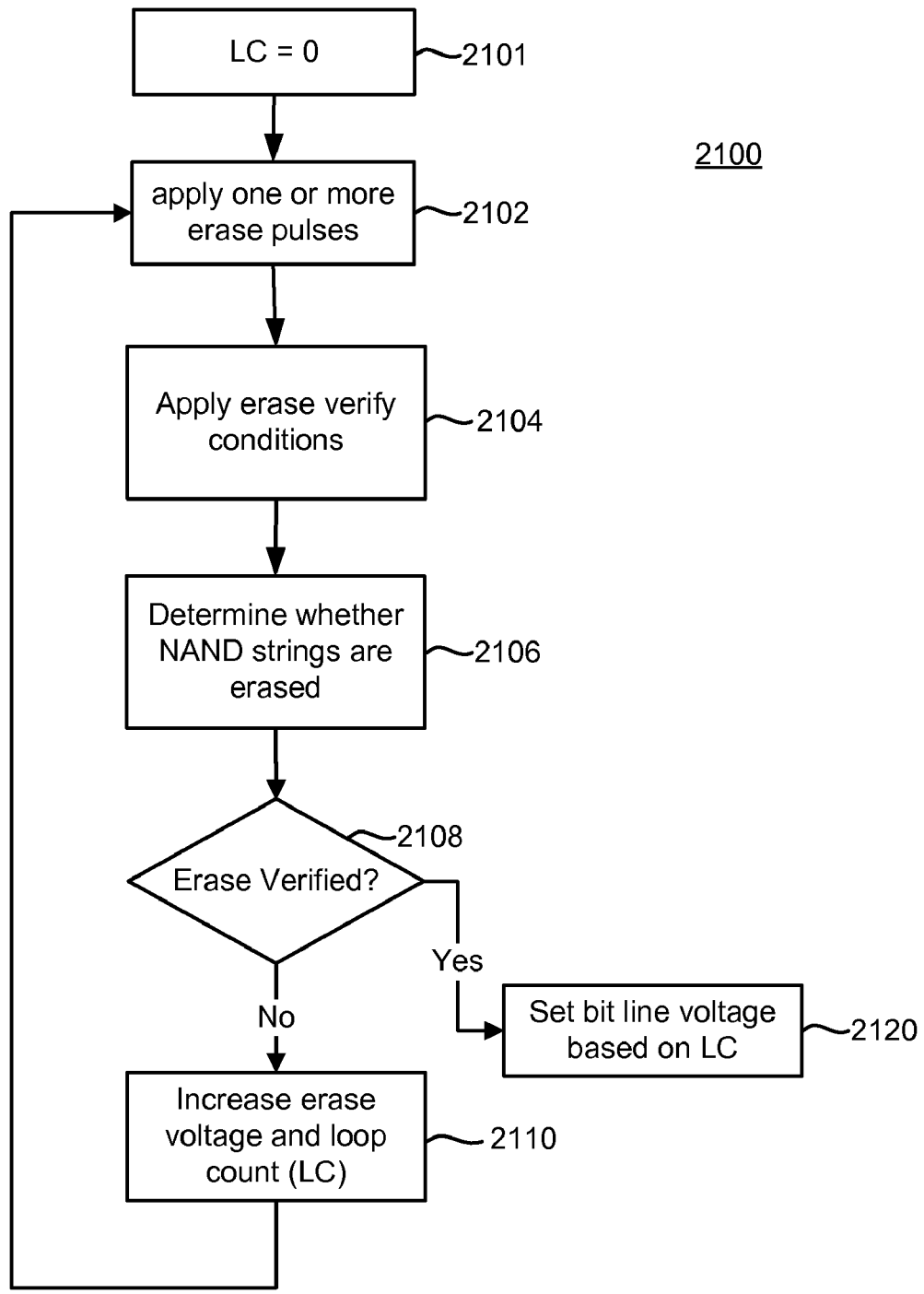
FIG. 21 is a flow chart describing the process of determining an appropriate voltage to apply to bit lines during reads, based on erasing memory cells.

FIG. 21 is a flow chart describing a process 2100 for erasing memory cells and setting a bit line voltage for reads based on how difficult it is to erase the memory cells. In step 2101, a loop count is initialized to 0. In step 2102, one or more erase voltages are applied. In one implementation, step 2102 includes raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells.

In step 2104, a set of erase verify conditions are applied to the memory cells. In one implementation, step 2104 includes discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string.

In step 2106, each of the NAND strings is sensed to determine whether the memory cells on the NAND string were sufficiently erased. Step 2166 is performed after waiting for a predetermined period of time for the charge to build up on the bit line. In one implementation, the voltage on a given bit line is compared to a reference value to determine whether any of the memory cells on the corresponding NAND string have a Vt that is above the target value. The target value could be a negative value. In some implementations, the memory cells are erased to as much as −3V.

In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 2108, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then control passes to step 2120 to set the bit line voltage based on the number of loops it took to erase the memory cells. In one embodiment, the harder it is to erase (higher loop count) indicates that a greater bitline voltage should be used during reads of the block that was just erased.

If, at step 2108, it is determined that erase verification failed, then the erase voltage is increased in step 2110. The erase voltage can be increased by any desired amount such as 0.2 V, 0.5 V, 1.0 V, etc. The loop count is incremented. The new erase voltage is applied in step 2102.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of forming a memory array of non-volatile storage elements, the method comprising:
    forming a first region including a first plurality of floating gate stacks above a substrate, the first region is for multi-level non-volatile storage elements;
    forming a second region including a second plurality of floating gate stacks above the substrate, the second region is for single-level non-volatile storage elements;
    implanting ions having a first concentration in the substrate for source/drain regions in the first region;
    implanting ions having a second concentration in the substrate near the source/drain regions in the first region, the conductivity type of the first concentration of ions is opposite the conductivity type of the second concentration of ions;
    implanting a third concentration of ions in the substrate for source/drain regions in the second region; and
    implanting a fourth concentration of zero or more ions in the substrate near the source/drain regions in the second region, either the first concentration is less than the third concentration or the second concentration is greater than the fourth concentration.

2. The method of claim 1, wherein the implanting a fourth concentration of zero or more ions includes implanting a non-zero concentration of ions as a halo implant, the second concentration is a halo implant, the first concentration and the second concentration are a first ratio, the third concentration and the fourth concentration are a second ratio, the second ratio is higher than the first ratio.

3. The method of claim 1, wherein the implanting ions having a first concentration for source/drain regions in the first region and the implanting a third concentration of ions for source/drain regions in the second region includes:
    implanting ions of a first conductivity type in the first region and the second region;
    masking the first region; and
    implanting ions of the first conductivity type in the second region, the first concentration is less than the third concentration.

4. The method of claim 1, wherein the implanting ions having a second concentration in the first region and the implanting ions having a fourth concentration in the second region includes:
    implanting ions of a first conductivity type in the first region and the second region;
    masking the second region; and
    implanting ions of the first conductivity type in the first region, the second concentration is greater than the fourth concentration.

5. The method of claim 1, wherein the forming a first region including a first plurality of floating gate stacks and the forming a second region including a second plurality of floating gate stacks includes:
    forming a first region including a first plurality of polysilicon strips to be used to form first floating gates above the substrate;
    forming a second region including a second plurality of polysilicon strips to be used to form second floating gates above the substrate;
    depositing isolation material between adjacent ones of the first plurality of polysilicon strips and between adjacent ones of the second plurality of polysilicon strips;
    performing a shallow etch back of the isolation material in the second region;
    performing a deep etch back of the isolation material in the first region;
    forming an inter-poly dielectric layer above the first floating gates in the first region and above the second floating gates in the second region; and
    forming first control gates above the first floating gates in the first region and second control gates above the second floating gates in the second region.

6. The method of claim 5, wherein:
    the performing a deep etch back includes etching back the isolation material to a first level to achieve a first coupling ratio between the first floating gates and the first control gates; and
    the performing a shallow etch back of the material in the second region includes etching back the isolation material to a first level to achieve a second coupling ratio between the second floating gates and the second control gates, the second coupling ratio is lower than the first coupling ratio.

7. The method of claim 1, wherein the forming the first region includes forming the multi-level non-volatile storage elements arraigned as a first plurality of NAND strings, the forming the second region includes forming the single-level non-volatile storage elements arraigned as a second plurality of NAND strings.

8. The method of claim 7, further comprising:
    forming first shallow trench isolation structures that separate adjacent ones of the first plurality of NAND strings; and
    forming second shallow trench isolation structures that separate adjacent ones of the second plurality of NAND strings, the first shallow trench isolation structures have a deep etch back and the second shallow trench isolation structures have a shallow etch back.

9. The method of claim 8, wherein:
    forming the non-volatile storage elements in the first NAND strings includes forming first floating gates and first control gates and forming the non-volatile storage elements in the second NAND strings includes forming second floating gates and second control gates;
    forming the deep etch back includes forming the deep etch back at a level to achieve a first coupling ratio between the first floating gates and the first control gates; and
    forming the shallow etch back includes forming the shallow etch back at a level to achieve a second coupling ratio between the second floating gates and the second control gates, the second coupling ratio is lower than the first coupling ratio.

10. The method of claim 8, wherein:
    forming the shallow etch back includes forming the shallow etch back at a level to inhibit charge from becoming trapped in the second shallow trench isolation structures when programming the second plurality of non-volatile storage elements.

11. A method of forming a memory array of non-volatile storage elements, the method comprising:
   forming a first region including a first plurality of polysilicon strips to be used to form first floating gates above a substrate, the first region is for multi-level non-volatile storage elements;
   forming a second region including a second plurality of polysilicon strips to be used to form second floating gates above the substrate, the second region is for single-level non-volatile storage elements;
   depositing isolation material between adjacent ones of the first plurality of polysilicon strips and between adjacent ones of the second plurality of polysilicon strips;
   performing a shallow etch back of the isolation material in the second region; and
   performing a deep etch back of the isolation material in the first region.

12. The method of claim 11, further comprising:
   forming an inter-poly dielectric layer above the floating gates in the first region and in the second region; and
   forming first control gates above the first floating gates in the first region, the performing a deep etch back includes etching to a first level to achieve a first coupling ratio between the first floating gates and the first control gates; and
   forming second control gates above the second floating gates in the second region, the performing a shallow etch back includes etching to a second level to achieve a second coupling ratio between the second floating gates and the second control gates, the second coupling ratio is less than the first coupling ratio.

13. The method of claim 12, wherein the performing a shallow etch back includes etching to the second level to prevent charge from being stored in the isolation material in the second region when programming the single-level non-volatile storage elements in the second region.

14. A method for forming a non-volatile storage system, comprising:
   forming a first plurality of NAND strings of non-volatile storage elements in a first region of a memory array, the first region is for multi-level non-volatile storage elements;
   forming a second plurality of NAND strings of non-volatile storage elements in a second region of the memory array, the second region is for single-level non-volatile storage elements;
   forming first shallow trench isolation structures that separate adjacent ones of the first plurality of NAND strings; and
   forming second shallow trench isolation structures that separate adjacent ones of the second plurality of NAND strings, the first shallow trench isolation structures have a deep etch back and the second shallow trench isolation structures have a shallow etch back.

15. The method for forming a non-volatile storage system as recited in claim 14, further comprising:
   providing one or more managing circuits in communication with the first plurality of NAND strings and the second plurality of NAND strings, the one or more managing circuits stores multiple bits per storage element in the first plurality of NAND strings and stores a single per storage element in the second plurality of NAND strings.

16. The method for forming a non-volatile storage system of claim 14, wherein:
   forming the non-volatile storage elements in the first NAND strings includes forming first floating gates and first control gates and forming the non-volatile storage elements in the second NAND strings includes forming second floating gates and second control gates;
   forming the deep etch back includes forming the deep etch back at a level to achieve a first coupling ratio between the first floating gates and the first control gates; and
   forming the shallow etch back includes forming the shallow etch back at a level to achieve a second coupling ratio between the second floating gates and the second control gates, the second coupling ratio is lower than the first coupling ratio.

17. The method for forming a non-volatile storage system 14, wherein:
   forming the shallow etch back includes forming the shallow etch back at a level to prevent charge from becoming trapped in the second shallow trench isolation structures when programming the non-volatile storage elements in the second NAND strings.

* * * * *